(12) United States Patent
Huebner et al.

(10) Patent No.: US 7,893,700 B2
(45) Date of Patent: Feb. 22, 2011

(54) CONFIGURATION OF SHARED TESTER CHANNELS TO AVOID ELECTRICAL CONNECTIONS ACROSS DIE AREA BOUNDARY ON A WAFER

(75) Inventors: Michael W. Huebner, Pleasanton, CA (US); Stefan J. Zschiegner, San Jose, CA (US)

(73) Assignee: FormFactor, Inc., Livermore, CA (US)

( * ) Notice: Subject to any disclaimer, the term of this patent is extended or adjusted under 35 U.S.C. 154(b) by 206 days.

(21) Appl. No.: 12/181,169

(22) Filed: Jul. 28, 2008

(65) Prior Publication Data

US 2010/0019787 A1 Jan. 28, 2010

(51) Int. Cl.
*G01R 31/02* (2006.01)
*G01R 31/26* (2006.01)

(52) U.S. Cl. .................. 324/754; 324/755; 324/761; 324/765

(58) Field of Classification Search .......... 324/754–765
See application file for complete search history.

(56) References Cited

U.S. PATENT DOCUMENTS

| | | | |
|---|---|---|---|
| 5,736,850 A | 4/1998 | Legal | |
| 6,798,225 B2 * | 9/2004 | Miller | 324/754 |
| 7,282,933 B2 | 10/2007 | Henson et al. | |
| 2008/0054917 A1 * | 3/2008 | Henson et al. | 324/754 |
| 2008/0136432 A1 * | 6/2008 | Chraft et al. | 324/755 |

\* cited by examiner

*Primary Examiner*—Ha Tran T Nguyen
*Assistant Examiner*—Emily Y Chan
(74) *Attorney, Agent, or Firm*—Kirton & McConkie

(57) ABSTRACT

A process or apparatus for testing a plurality of semiconductor dies on a semiconductor wafer utilizing a tester configured to test the dies in groups can include controlling as a logical whole provision of first test signals through a plurality of first communications channels to first probes organized into a plurality of N first probe die groups each configured to contact a different one of the dies of the wafer. One of the first communications channels can be a first common communications channel connected to probes in X of the N first probe die groups but not to probes in Y of the N first probe die groups. X can be at least two and Y can be at least one. The process can also include controlling as a logical whole provision of second test signals through a plurality of second communications channels to second probes organized into a plurality of second probe die groups each configured to contact a different one of the dies of the wafer. One of the second communications channels can be a second common communications channel connected to probes in all of the second probe die groups and probes in each of the Y of the first probe die groups.

20 Claims, 21 Drawing Sheets

Fig. 15

|  |  | 1204, 1206 |  | 1202, 1208 |  |
|---|---|---|---|---|---|
| A | B | C | D | E | F |
| G | H | I | J | K | L |
| M | N | O | P | Q | R |
| S | T | U | V | W | X |
| Y | Z | AA | BB | CC | DD |
| EE | FF | GG | HH | II | JJ |
|  | 1202, 1208 |  | 1204, 1206 |  |  |

CONFIGURATION OF SHARED TESTER CHANNELS TO AVOID ELECTRICAL CONNECTIONS ACROSS DIE AREA BOUNDARY ON A WAFER

BACKGROUND

Semiconductor dies are typically made many at a time on a semiconductor wafer. The dies are tested by bringing bond pads (e.g., input and/or output terminals) of the dies into contact with electrically conductive probes of a probe card assembly. The probes establish temporary electrical connections with the bond pads, allowing test signals to be provided to and from the contacted dies. A tester, which can be a computer or a computer system, can control testing of the dies by providing test signals through the probe card assembly and probes to the bond pads of the contacted dies and monitoring responsive test signals generated by those dies. The tester is typically configured to control testing of the dies in groups of more than one die, and the probe card is often configured to provide at least some of the test signals to more than one die in a group of the dies that are tested as a logical whole by the tester. As discussed in more detail below, some embodiments of the present invention can solve problems that can arise from use of such a common test signal provided to more than one of the dies in a group of dies tested by the tester as a logical whole.

SUMMARY

In some embodiments, a process of testing a plurality of semiconductor dies on a semiconductor wafer utilizing a tester configured to test the dies in groups can include controlling as a logical whole provision of first test signals through a plurality of first communications channels to first probes organized into a plurality of N first probe die groups each configured to contact a different one of the dies of the wafer. One of the first communications channels can be a first common communications channel connected to probes in X of the N first probe die groups but not to probes in Y of the N first probe die groups. X can be at least two and Y can be at least one. The process can also include controlling as a logical whole provision of second test signals through a plurality of second communications channels to second probes organized into a plurality of second probe die groups each configured to contact a different one of the dies of the wafer. One of the second communications channels can be a second common communications channel connected to probes in all of the second probe die groups and probes in each of the Y of the first probe die groups.

In some embodiments, a process of testing semiconductor dies on a semiconductor wafer can include receiving at a probe card assembly first test signals through first communications channels. The first test signals can be for testing as a logical whole a first group of N of the dies, and the first communications channels can include a first common communications channel. The process can also include receiving at the probe card assembly second test signals through second communications channels. The second test signals can be for testing as a logical whole a second group of the dies, and the second communications channels can include a second common communications channel. The process can also include providing the first test signals through the probe card assembly to first probes of the probe card assembly. The first probes can be organized into a plurality of N first probe die groups each configured to contact a different one of the dies, and a test signal received on the first common communications channel can be provided to probes in X of the N first probe die groups but not to probes in Y of the N first probe die groups. The process can also include providing the second test signals through the probe card assembly to second probes of the probe card assembly. The second probes organized into a plurality of second probe die groups each configured to contact a different one of the dies, and a test signal received on the second common communications channel can be provided to probes in all of the second probe die groups and probes in each of the Y of the first probe die groups.

In some embodiments, a test system for testing dies of a semiconductor wafer can include a tester configured to control testing of the dies. A plurality of communications channels can be connected to the tester. A probe card assembly can comprise an interface to the communications channels and to a plurality of probes. The probes can include first probes organized into a plurality of N first probe die groups each configured to contact a different one of the dies of the wafer. The probes can further include second probes organized into a plurality of second probe die groups each configured to contact a different one of the dies of the wafer. The tester can be configured to control as a logical whole provision of first test signals through a plurality of first ones of the communications channels that are electrically connected through the probe card assembly to the first probes. One of the first communications channels can be a first common communications channel connected through the probe card assembly to probes in X of the N first probe die groups but not to probes in Y of the N first probe die groups. X can be at least two and Y can be at least one. The tester can be configured to control as a logical whole provision of second test signals through a plurality of second ones of the communications channels to the second probes. One of the second communications channels can be a second common communications channel connected through the probe card assembly to probes in all of the second probe die groups and probes in each of the Y of the first probe die groups.

In some embodiments, a probe card assembly can include an interface to communications channels from a tester configured to control testing of semiconductor dies of a wafer. The interface can include first individual connections to first communications channels and second individual connections to second communications channels. The probe card assembly can also include a plurality of probes, which can include first probes and second probes. The first probes can be organized into N first probe die groups each configured to contact a different die of the wafer and second probes organized into second probe die groups each configured to contact a different die of the wafer. First dedicated electrical paths can connect one of the first individual connections to one or more of the first probes in only one of the first probe die groups, and a first common electrical path can connect one of the first individual connections through the probe card assembly to probes in X of the N first probe die groups but not to probes in Y of the N first probe die groups. Second dedicated electrical paths can connect one of the second individual connections to one or more of the second probes in only one of the second probe die groups, and a second common electrical path can connect one of the second individual connections through the probe card assembly to probes in each of the second probe die groups and to the Y probes in each of the Y of the first probe die groups.

BRIEF DESCRIPTION OF THE DRAWINGS

FIGS. 12-15 illustrate an example of projecting portions of the die area boundary onto the pattern of probe die groups of the probe card assembly according to some embodiments of the invention.

DETAILED DESCRIPTION OF EXEMPLARY EMBODIMENTS

Figure 1:
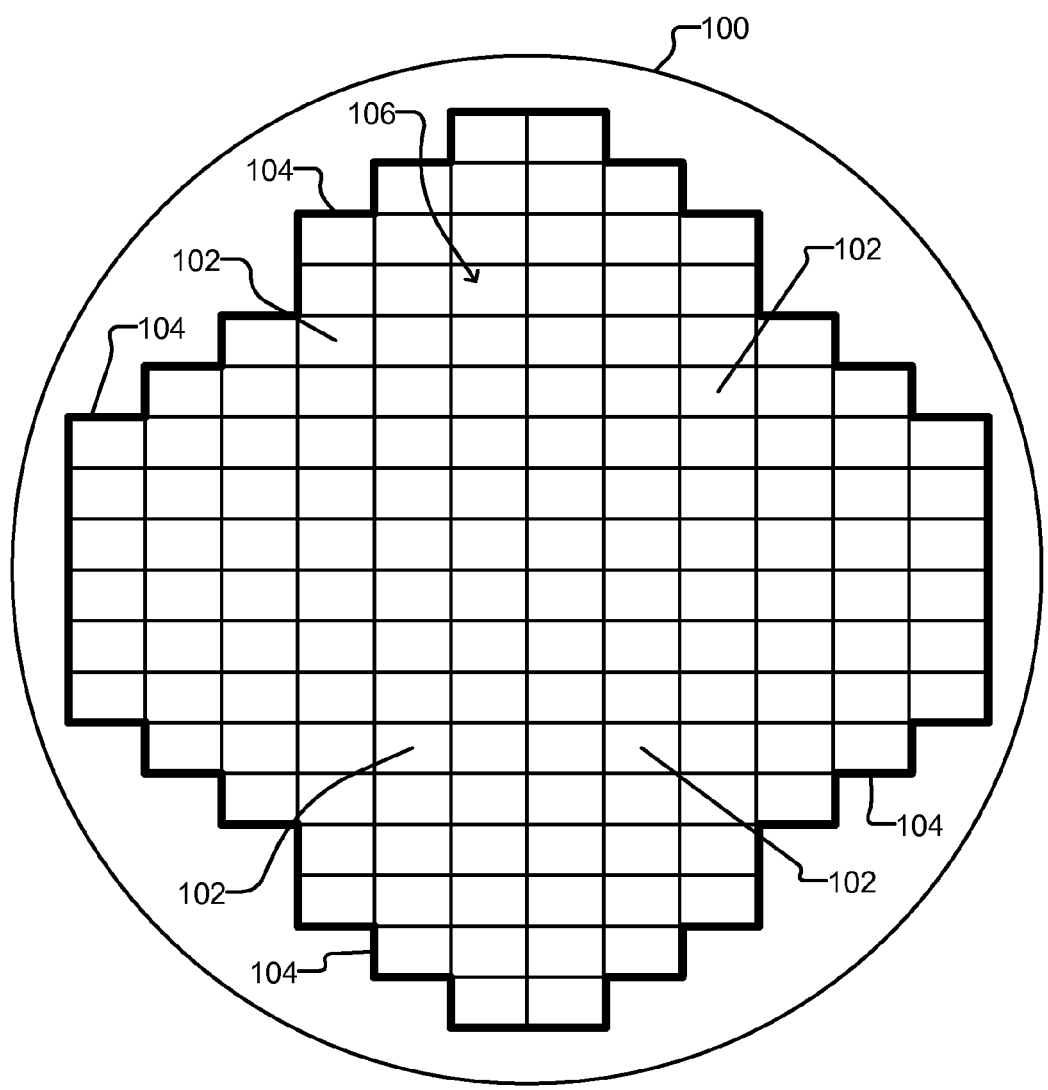
FIG. 1 shows exemplary semiconductor dies on a semiconductor wafer.

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on" and "attached to" are used herein, one object (e.g., a material, a layer, a substrate, etc.) can be "on" or "attached to" another object regardless of whether the one object is directly on or attached to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

Embodiments of the invention can relate to processes, apparatuses, and/or systems for testing semiconductor dies on a semiconductor wafer. As used herein, the following terms have the following means:

A "probe die group" is a group of probes configured to contact a sufficient number of terminals of one die to test the die for a desired test.

A "probe die group set" is at least two probe die groups connected to a "channel set" (defined below).

A "channel set" is a plurality of communications channels from a tester (or test controller) sufficient to provide connections between the tester and the probes in a probe die group set; and the tester is configured to control testing (e.g., provide test signals to and monitor test signals on) the channels of a channel set as a logical whole. That is, the tester is configured to perform tests through a channel set as a logical whole, but the tester is not configured with the ability to control or run testing through only a portion of the channel set without also controlling or running test signals through another portion of the channel set.

A "common communications channel" is a channel that is connected to more than one probe in more than one probe die group. That is, a common communications channel is connected to at least two probes that contact at least two different dies. A common communications channel is thus shared between at least two dies and thus can simultaneously provide a test signal to more than one die.

A "dedicated channel" can be connected to one or more probes, but all of the probes to which a dedicated channel is connected contact one and only one die. A dedicated channel is thus not shared between more than one die but provides a test signal to one and only one die.

A "test signal" includes any signal provided to a die to test the die and any signal generated by the die in response to a signal provided to the die; "test signals" include without limitation power, ground, data and control signals for input to a die, and response signals generated by the die in response to such input signals.

Figure 2:
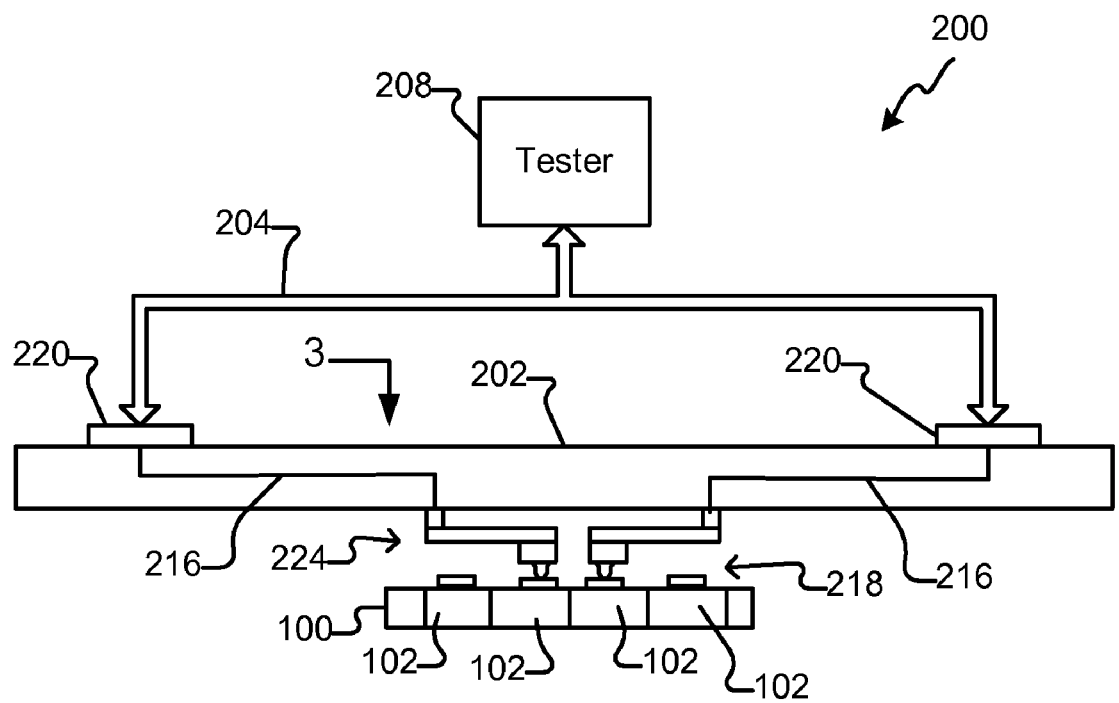
FIG. 2 illustrates an exemplary test system that can be used to test the dies of FIG. 1.

FIG. 1 illustrates a plurality of semiconductor dies 102 on a semiconductor wafer 100 that can be tested by embodiments of the present invention. A die area 106 is enclosed by boundary 104. Die area 106 is the area on wafer 100 on which dies 102 are intentionally manufactured. Die area 106 thus includes locations where the manufacturer intends to manufacture complete dies 102, but die area 106 does not include locations where partially dies may be inadvertently made on wafer 102. Such locations would be outside the boundary 104. As is known, semiconductor dies 102 can be made many at a time on a semiconductor wafer 100. For example, a few, tens, hundreds, or thousands of dies 102 can be made on a wafer 100. The dies 102 can be tested while still part of wafer 100. FIG. 2 illustrates a simplified system 200 that can be used to test the dies 102 of wafer 100.

As shown in FIG. 2, test system 200 can include tester 208, a contactor device such as a probe card assembly 202, and communications channels 204 between the tester 208 and the probe card assembly 202. The communications channels 204 can be any type of communication medium capable of carrying power and signals between tester 208 and probe card assembly 202. For example, communications channels 204 can comprise, without limitation, coaxial cables, twisted pairs of wires, fiber optic links, and/or wireless links. Probe card assembly 202 can comprise tester connections 220 for making electrical connections with the communications channels 204. Electrical connections 216 through probe card assembly 202 can electrically connect the tester connections 220 with electrically conductive probes 224, which can contact and thereby make electrical connections with terminals 218 (e.g., bond pads) of one or more of the dies 102 of wafer 100. (Tester connections 220 and/or electrical connections 216 can be a non-limiting example of an interface to communications channels.) As is known, each die 102 can have a plurality of input and/or output terminals 218 through which power and electrical signals can be provided to each die 102 and through which electrical signals can be read from each die 102. For simplification and ease of illustration, two probes 224 contacting two terminals 218 of two dies 102 are shown in FIG. 2, but probe card assembly 202 can include hundreds or thousands of probes 224 for contacting a few, tens, hundreds, or thousands of terminals 218 of one, a few, tens, hundreds, or thousands of dies 102 of wafer 100. As shown in FIG. 1, communications channels 204, tester connections 220, and electrical connections 216 through probe card assembly 202 to probes 224 can provide a plurality of individual communications paths (not separately labeled) between the tester 208 and individual probes 224 (and thus individual terminals 218 of dies 102). The probe card assembly 202 can be a single wiring board or substrate, or the probe card assembly 202 can be an assembly of multiple interconnected wiring substrates. Non-limiting examples of suitable probe card assemblies 202 include the probe card assemblies or contactors disclosed in U.S. Pat. No. 5,974,662; U.S. Pat. No. 6,509,751; and US Patent Application Publication No. 2006/0290367.

Tester 208, which can comprise one or more computers, can control functional testing of dies 102 by, for example, generating test signals that are provided through communications channels 204, tester connections 220, electrical connections 216, and probes 224 to dies 102. (The tester 208 can thus be a source of test signals.) Tester 208 can also receive (or monitor) test signals output by the dies 102 in response to the test signals input into dies 102. Test signals generated and output by the dies 102 in response to the test signals input into the dies 102 can be provided to the tester through probes 224, electrical connections 216, tester connections 220, and communications channels 204. Tester 208 can evaluate the test signals generated and output by the dies 102 to determine whether the dies 102 pass the testing and/or to rate the dies 102. The tester 208 can also control other types of testing of dies 102.

Figure 3:
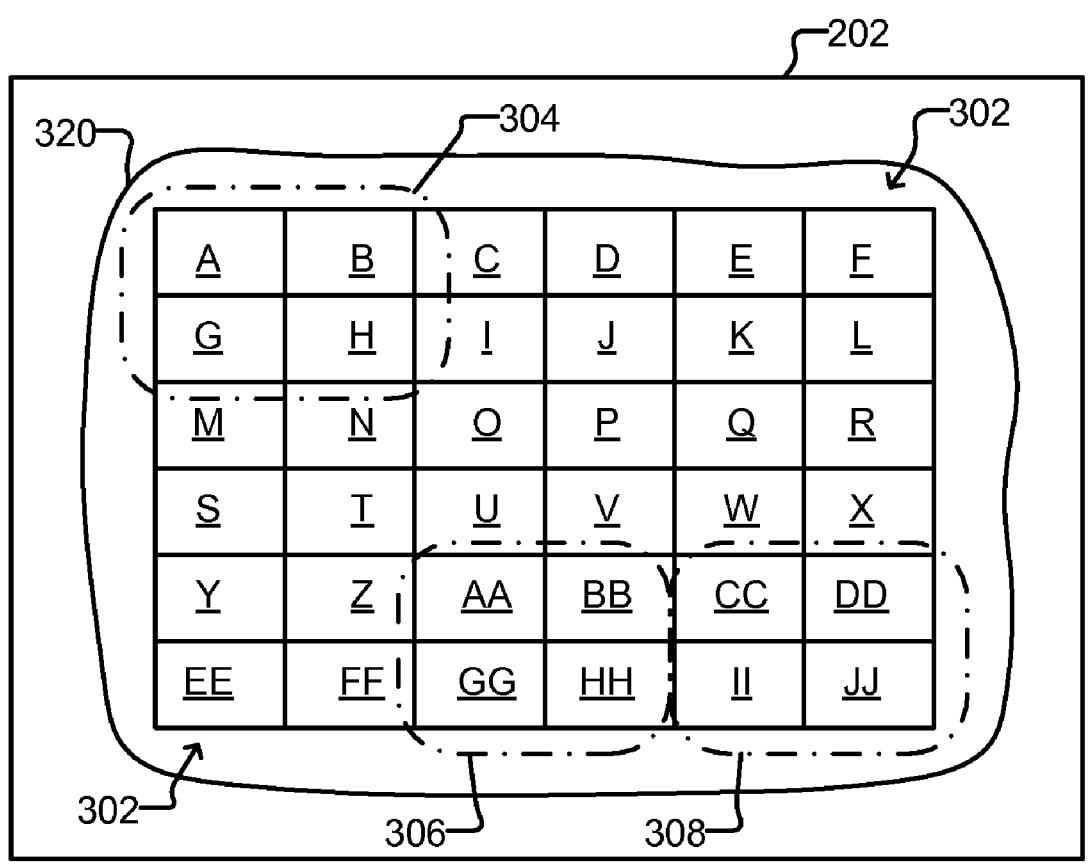
FIG. 3 shows the probe card assembly of the test system of FIG. 2 with a cut away to show probe die groups of the probe card assembly.

The probes 224 can be electrically conductive, resilient spring-like probes. The probes 224 can be organized into probe die groups. Each probe die group can include sufficient probes 224 to contact all or enough of the terminals 218 of one die 102 to test the die 102 for a desired test. In FIG. 3 thirty-six probe die groups 302 (each illustrated as a box in FIG. 3) are shown and are labeled A, B, C, D, E, F, G, H, I, J, K, L, M, N, O, P, Q, R, S, T, U, V, W, X, Y, Z, AA, BB, CC, DD, EE, FF, GG, HH, II, and JJ. (FIG. 3 shows a top view of probe card assembly 202 with a cutout 320 so that probe die groups 302 are visible.) Configured as shown in the non-limiting example of FIG. 3, probe card assembly 202 can simultaneously contact thirty-six dies 102 of wafer 100. Thirty-six probe die groups 302 is exemplary only, and probes 224 can be organized into fewer or more probe die groups 302. Also, the pattern or layout of probe die groups 302 shown in FIG. 3 is exemplary only, and other patterns or layouts can be used. For example, although a pattern of six rows and six columns of probe die groups 302 is shown in FIG. 3, other numbers of rows and/or columns can be used. Also, probe die groups 302 can be laid out in a pattern other than a square or a rectangle.

Figure 4A:
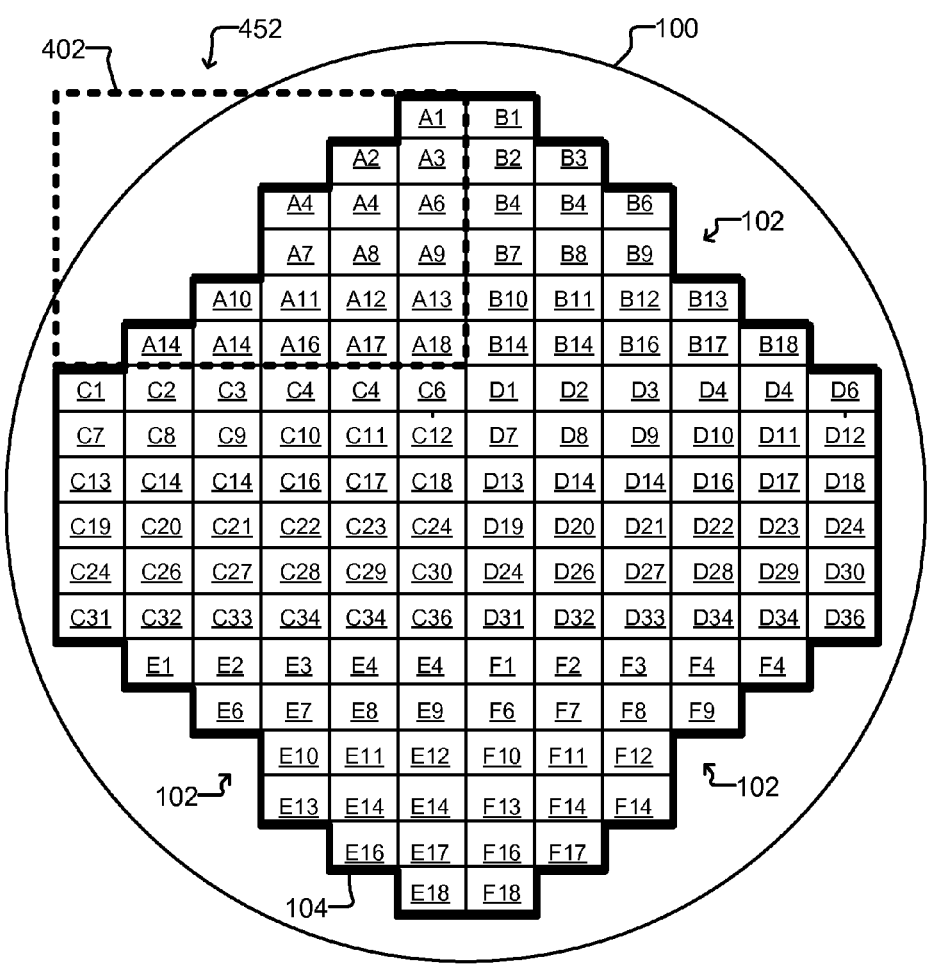
FIGS. 4A-4D illustrate an exemplary sequence of touchdowns of the probe card assembly on the dies of the wafer.

If there are fewer probe die groups 302 than dies 102, probe card assembly 202 can be touched down on dies 102 of wafer 100 multiple times. FIGS. 4A-4D illustrate a non-limiting example. FIG. 4A illustrates an exemplary first touchdown 452 of probe card assembly 202 onto dies 102 of wafer 100. The location of the probe die groups 302 on probe card 202 during the first touchdown 452 is illustrated in FIG. 4A by dashed outline 402, which can represent a location of an outer perimeter of probe die groups 302 (see FIG. 3) during the first touchdown 452. Thus, during the first touchdown 452, ones of dies 102 within dashed outline 402 can be contacted by probes 224 of probe card assembly 202 and tested by tester 208. Those dies 102 are labeled A1-A18 in FIG. 4A.

Figure 4B:
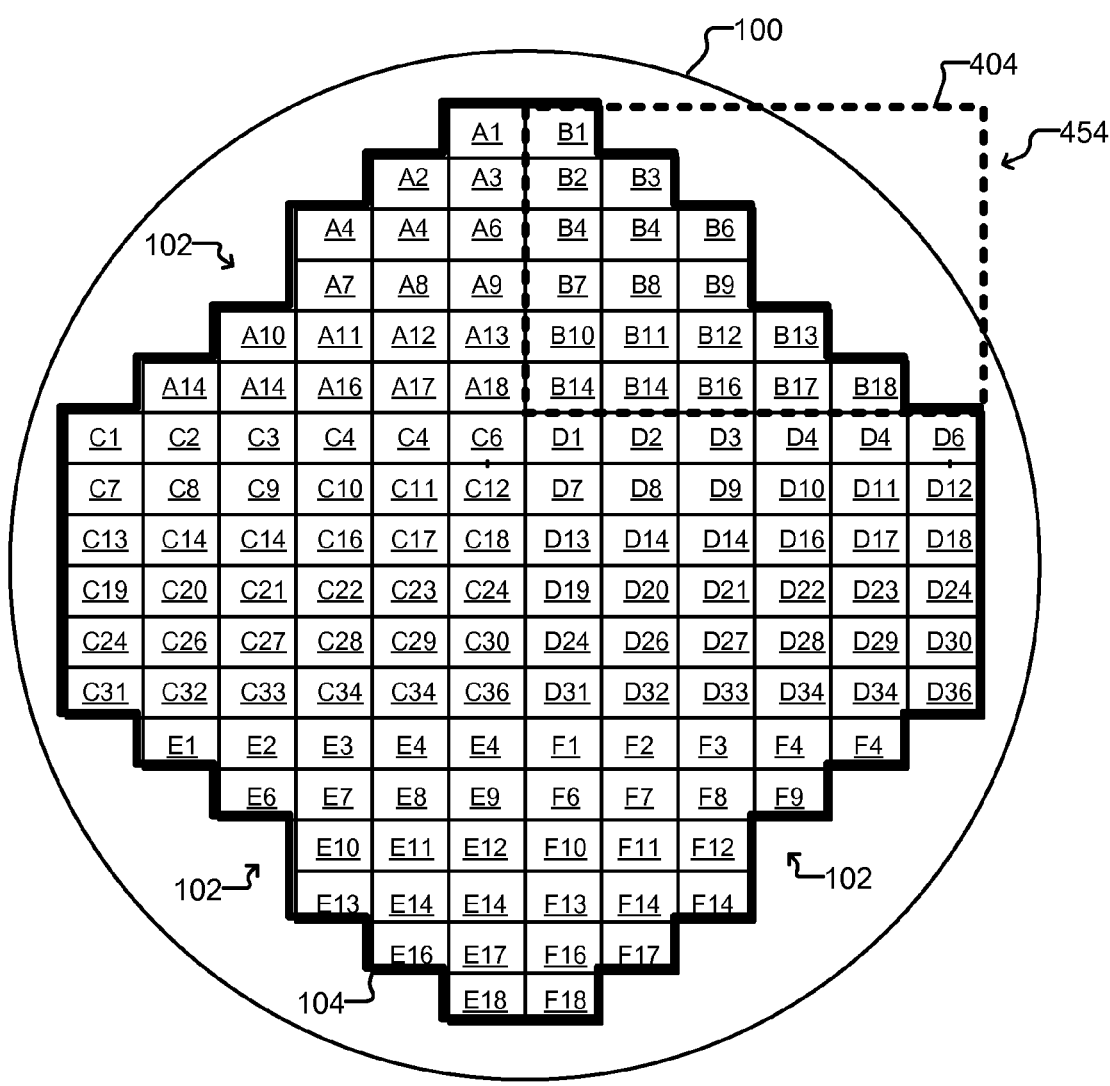

After testing the dies 102 contacted during the first touchdown 452, the wafer 102 and/or the probe card assembly 202 can be repositioned, and a second touchdown of probe card assembly 202 on dies 102 can be effected. FIG. 4B illustrates an exemplary second touchdown 454 of probe card assembly 202 onto dies 102 of wafer 100. The location of the probe die groups 302 on probe card 202 during the second touchdown 454 is illustrated in FIG. 4B by dashed outline 404, which can represent a location of an outer perimeter of probe die groups 302 (see FIG. 3) during the second touchdown 454. Thus, during the second touchdown 454, ones of dies 102 within dashed outline 404 can be contacted by probes 224 of probe card assembly 202 and tested by tester 208. Those dies 102 are labeled B1-B18 in FIG. 4B.

Figure 4C:
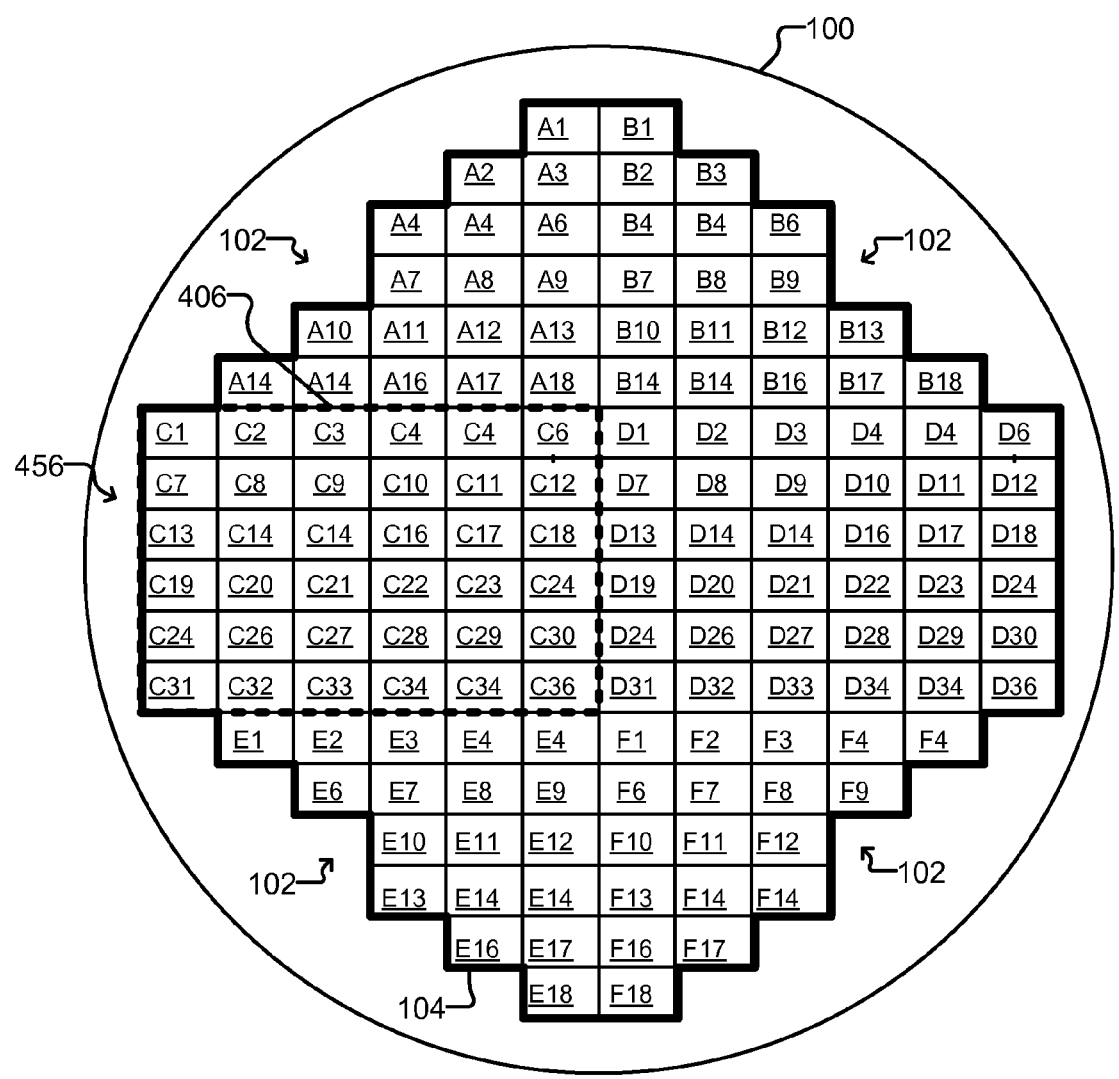

After testing the dies 102 contacted during the second touchdown 454, the wafer 102 and/or the probe card assembly 202 can again be repositioned, and a third touchdown of probe card assembly 202 on dies 102 can be effected. FIG. 4C illustrates an exemplary third touchdown 456 of probe card assembly 202 onto dies 102 of wafer 100. The location of the probe die groups 302 on probe card 202 during the third touchdown 456 is illustrated in FIG. 4C by dashed outline 406, which can represent a location of an outer perimeter of probe die groups 302 (see FIG. 3) during the third touchdown 456. Thus, during the third touchdown 456, ones of dies 102 within dashed outline 406 can be contacted by probes 224 of probe card assembly 202 and tested by tester 208. Those dies 102 are labeled C1-C36 in FIG. 4C.

Figure 4D:
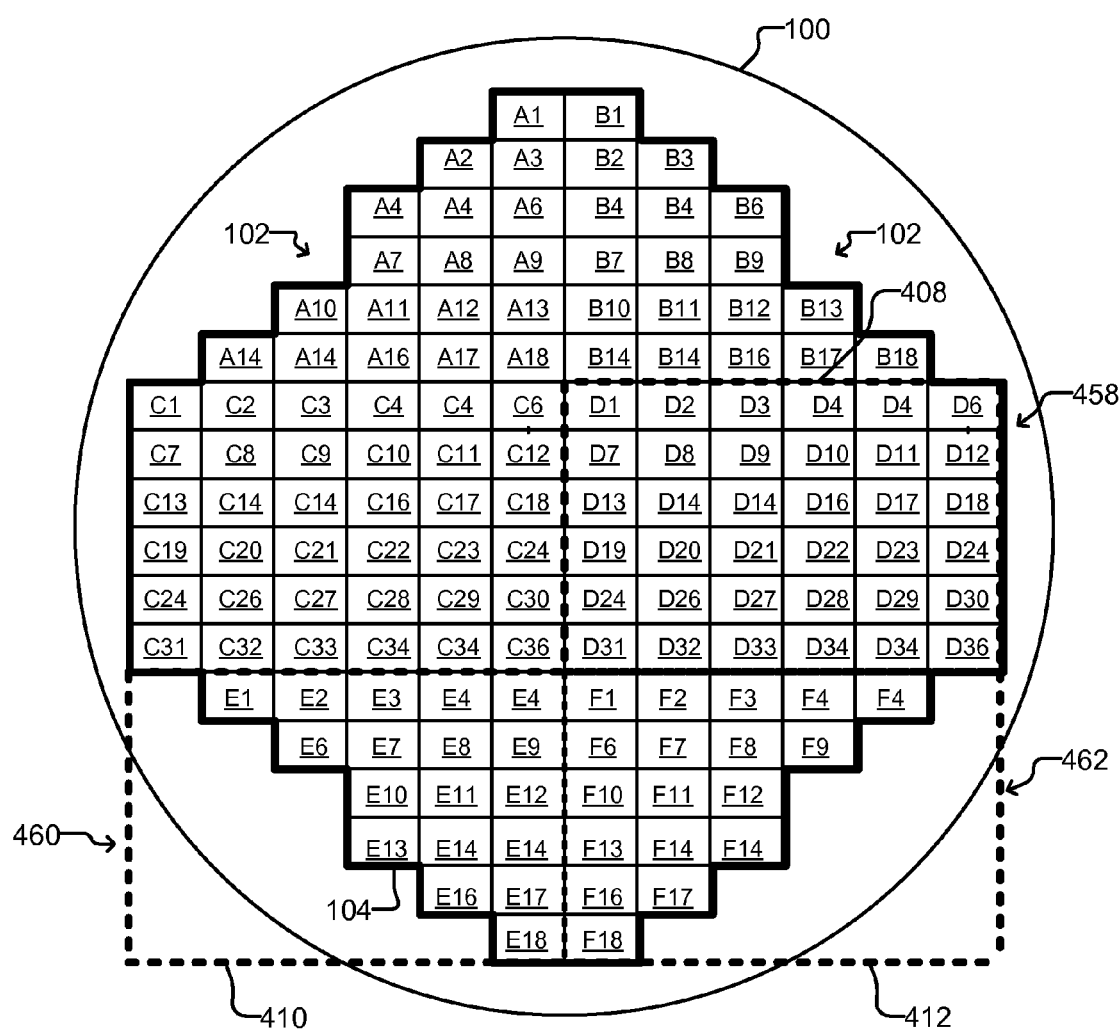

Additional touchdowns can be effected as needed. For example, FIG. 4D illustrates three additional touchdowns—in the example shown, a fourth touchdown 458, a fifth touchdown 460, and a sixth touchdown 462—of probe card assembly 202 onto dies 102 of wafer 100. The location of the probe die groups 302 on probe card 202 during the fourth touchdown 458 is illustrated in FIG. 4D by dashed outline 408. The locations of the probe die groups 302 on wafer 100 during the fifth down E is illustrated in FIG. 4D by dashed outline 410, and the location of the probe die groups 302 on wafer 100 during the sixth touchdown 462 is illustrated in FIG. 4D by dashed outline 412. Thus, during the fourth touchdown 458, probes 224 can contact dies 102 within dashed lines 408 (labeled D1-D36 in FIG. 4D); during the fifth touchdown 460, probes 224 can contact dies 102 within dashed lines 410 (labeled E1-E18 in FIG. 4D); and during the sixth touchdown 462, probes 224 can contact dies 102 within dashed lines 412 (labeled F1-F18 in FIG. 4D). The number, pattern, and/or sequence of touchdowns illustrated in FIGS. 4A-4D is exemplary only, and a different number, pattern, and/or sequence of touchdowns can alternatively be used. Moreover, the number and pattern of dies 102 on a wafer 102 illustrated in FIGS. 1 and 4A-4D is exemplary only, and a different number of dies 102 in a different pattern on wafer 100 can alternatively be contacted and tested.

Referring again to FIGS. 2 and 3, probe die groups 302 can be connected to and controlled as whole by the tester 208 in sets of multiple probe die groups 302. As defined above, such a set of probe die groups 302 can be termed a probe die group set. For example, probe die groups 302 in the non-limiting example illustrated in FIG. 3 can be connected to the tester 208 in probe die group sets that each include four probe die groups 302. For example, probe die groups A, B, G, and H can be one probe die group set 304. Other probe die group sets can be as follows: C, D, I, and J; E, F, K, and L; M, N, S, and T; O, P, U, and V; Q, R, W, and X; Y, Z, EE, and FF; AA, BB, GG, and HH (set 306 in FIG. 3); and CC, DD, II, and JJ (set 308 in FIG. 3). The foregoing groupings of probe die groups 302 into probe die group sets is exemplary only, and other groupings can be used. Moreover, four probe die groups 302 per probe die group set is also exemplary, and fewer or more probe die groups 302 can be in a probe die group set.

Figure 5:
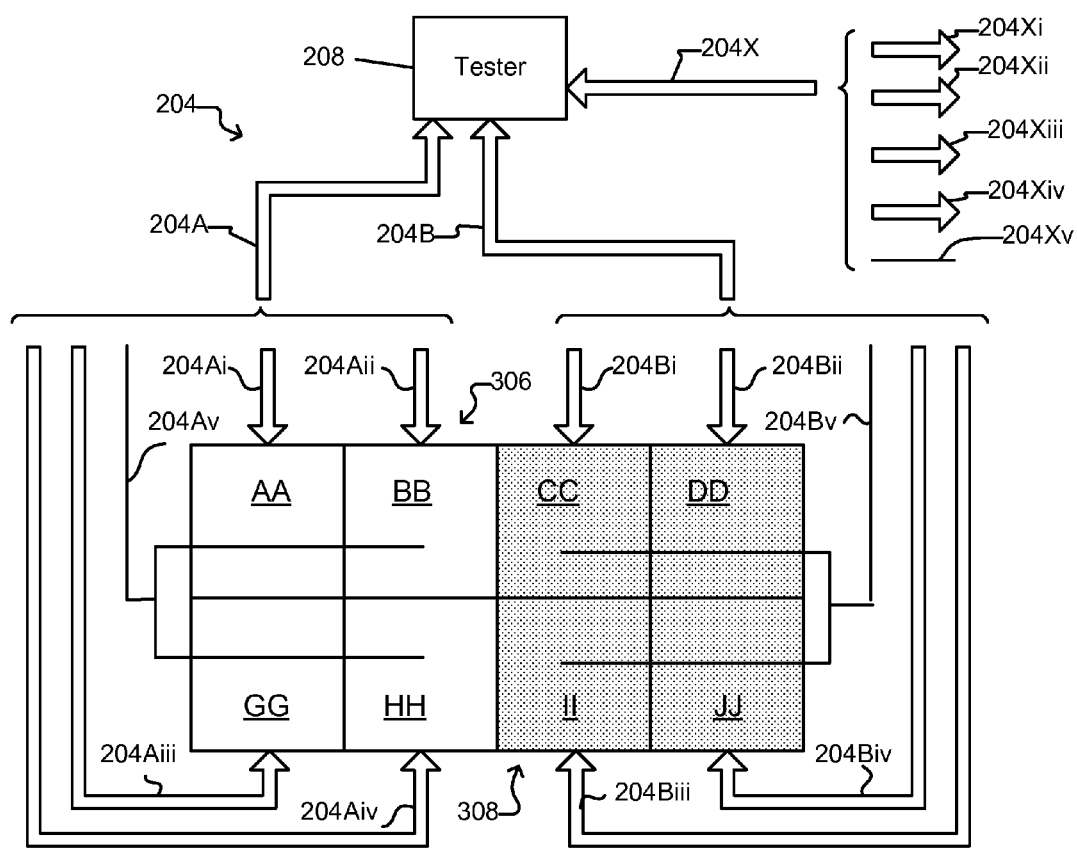
FIG. 5 illustrates an exemplary connection of channel sets to probe die group sets of the test system of FIG. 2.

The channels 204 can be connected to the probe die groups 302 by channel sets. That is, the channels 204 in a channel set can be connected to the probes in a probe die group set. FIG. 5 shows channels 204 divided into channel sets 204A, 204B, ... 204X each of which can comprise channels for connection to probes in a probe die group set. FIG. 5 illustrates a non-limiting example in which channel set 204A can be connected to probe die group set 306 (comprising probe die groups AA, BB, GG, and HH) and channel set 204B can be connected to probe die group set 308 (comprising probe die groups CC, DD, II, and JJ).

Referring to FIG. 5, a channel set 204A can be electrically connected (e.g., through connectors 220 and probe card assembly 202 (see FIG. 2)) to the probes of probe die group set 306, which can include probe die groups AA, BB, GG, and HH. Channels 204Ai, 204Aii, 204Aiii, 204Aiv, and 204Av can be channels 204 of the channel set 204A. Channels 204Ai can be individually connected to probes of probe die group AA. That is, channels 204Ai can include several individual channels 204, each of which can be connected to one or more probes 224 in probe die group AA. Because each of channels 204Ai is connected to a probe 224 in probe die group AA, channels 204Ai can be dedicated channels. Similarly, each of channels 204Aii can be connected to one or more probes 224 in probe die group BB; each of channels 204Aiii can be connected to one or more probes 224 in probe die group GG; and each of channels 204Aiv can be connected to one or more probes 224 in probe die group HH. Channels 204Aii, 204Aiii, and 204Aiv can thus also be referred to as dedicated channels. For example, channels 204Ai, 204Aii, 204Aiii, and 204Aiv can be configured to carry test signals, power, or ground from tester 208 to probe card assembly 202 and through probe card assembly 202 to individual input terminals 218 of dies 102. Channels 204Ai, 204Aii, 204Aiii, and 204Aiv can alternatively or also be configured to carry test signals generated by the dies 102 from output terminals 218 of dies 102 and probe card assembly 202 to tester 208.

In contrast, as shown in FIG. 5, channel 204Av can be connected to multiple probes 224 in multiple probe die groups AA, BB, GG, and HH of probe die group set 306. For example, in FIG. 5, channel 204Av can be connected to a probe 224 in probe die group AA, a probe 224 in probe die group BB, a probe 224 in probe die group GG, and a probe 224 in probe die group HH. Because channel 204Av is shared among multiple probes 224 in multiple probe die groups AA, BB, GG, and HH, channel 204Av can be referred to as a common communications channel. Channel 204Av can be shared among multiple probes 224 by, for example, electrical connections 216 through probe card assembly 202 that connect a connection in connector 220 to channel 204Av to multiple probes 224 (see FIG. 2).

Referring to FIG. 5, channel set 204B can similarly be connected (e.g., through connector 220 and probe card assembly (see FIG. 2)) to probes 224 in probe die groups CC, DD, II, and JJ of probe die group set 308. For example, channels 204Bi can be connected to probes 224 in probe die group CC; channels 204Bii can be connected to probes 224 in probe die group DD; channels 204Biii can be connected to probes 224 in probe die group II; and channels 204Biv can be connected to probes 224 in probe die group JJ. Channels 204Bi, 204Bii, 204Biii, and 204Biv can thus be dedicated channels (generally like channels 204Ai, 204Aii, 204Aiii, and 204Aiv). Channel 204Bv—which can be a common communications channel generally like channel 204Av—can be connected to probes 224 in each of probe die groups CC, DD, II, and JJ in set 308.

Other channel sets (e.g., 204X) can likewise be connected from tester 208 (e.g., through connector 220 and probe card assembly (see FIG. 2)) to other probe die group sets. For example, channel set 204X can connect tester 208 to probe die group set 304 (see FIG. 3). Dedicated channels 204Xi, 204Xii, 204Xiii, and 204Xiv can connect, respectively, to probes in probe die groups A, B, G, and H, and common communications channel 204Xv can connect to probes in each of probe die groups A, B, G, and H. Channel sets similar to 204X be similarly connected to the following probe set groups: C, D, I, and J; E, F, K, and L; M, N, S, and T; O, P, U, and V; Q, R, W, and X; Y, Z, EE, and FF. Alternatively, one or more other channel sets (e.g., 204X) can be unused or reserve.

As mentioned, tester 208 can be configured to control testing through a channel set (e.g., 204A, 204B, or 204X)—and thus the probe die group set (e.g., 304, 306, or 308) to which the channel set is connected—as a logical whole. For example, referring to FIG. 5, tester 208 can be configured to control testing as a logical whole (or simultaneously) through channel set 204A and thus probe die group set 306 (which includes probe die groups AA, BB, GG, and HH). That is, tester 208 can be configured such that it provides and senses test signals on all of the channels 204 of channel set 204A—and thus through all of the probes 224 in probe die groups AA, BB, GG, and HH—without the ability to provide or sense test signals on less than all of the channels of channel set 204A. Similarly, tester 208 can be configured to simultaneously control testing through all the channels 224 in channel set 204B—and thus through all of the probes of probe die groups CC, DD, II, and JJ in probe die group set 308—without the ability to control testing through fewer than all of channels of channel set 304B.

The number of probe die groups 302 that share a shared channel (e.g., like 204Av, 204Bv, or 204Bx in FIG. 5) can be fewer or more than four. Probe die group sets that the tester 208 is configured to control as or whole simultaneously can likewise have fewer or more than four probe die groups. The configurations illustrated in FIG. 5 and discussed above with respect to FIG. 3 are therefore exemplary only and are not limiting. For example, channel sets 204A, 204B, and 204X can each have more than one shared channel, e.g., channel set 204A can have more than one shared channel 204Av, channel set 204B can have more than one shared channel 204Bv, and channel set 204X can have more than one shared channel 204Xv.

As illustrated in the example of FIGS. 4A-4D, the pattern and/or number of probe die groups 302 need not match the pattern and/or number of dies 102 contacted during each touchdown. For example, in the non-limiting example shown in FIGS. 4A-4D, the pattern and number of dies 102 (dies A1-A18) contacted during the first touchdown 452 does not match the pattern and number of probe die groups 302 (see FIG. 3). For example, probe die groups F, K, L, P-R, V-X, AA-DD, and FF-JJ (see FIG. 3) contact dies A1-A18 during touchdown 452. Probe die groups A-E, G-J, M-O, S-U, Y, Z, and EE do not contact any of dies 102 within the boundary 104 of the die area 106 of wafer 100 during the first touchdown 452. As another example, probe die groups A, G, H, M-O, S-V, Y, Z, AA, BB, and EE-II (see FIG. 3) contact dies B1-B18 during touchdown 454, but probe die groups B-F, I-L, P-R, V-X, CC, DD, and JJ do not contact any of dies 102 during the second touchdown 454. Similarly, not all of probe die groups 302 contact dies 102 within the boundary 104 of the die area 106 of wafer 100 during touchdowns 460 and 462 in the non-limiting example shown in FIGS. 4A-4D.

Figure 6:
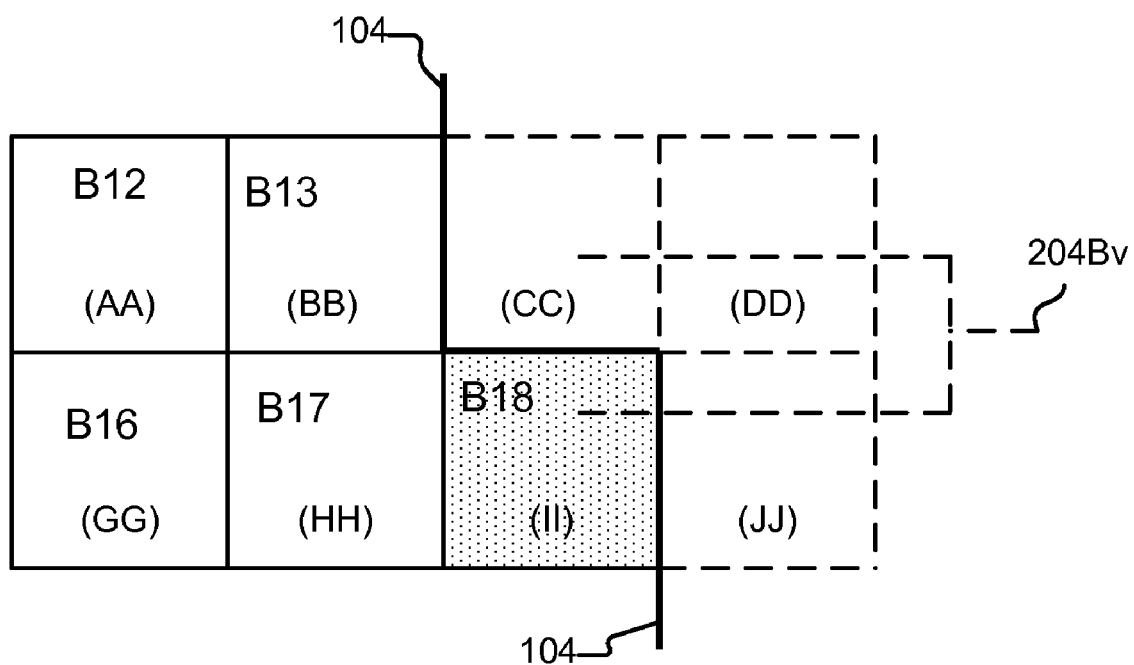
FIG. 6 illustrates a common communications channel being connected between probes on different sides of a boundary of a die area on the wafer.

That some probe die groups 302 do not touch dies 102 within the boundary 104 of the die area 106 of wafer 100 during a touchdown 456 can give rise to problems. This can be because two or more probe die groups 302 share a common electrical connection (e.g., are connected to a common communications channel like common communications channel 204Av, 204Bv, or 204Xv as shown in FIG. 5). Problems can arise where such a common electrical connection connects a probe in a probe die group that contacts a die 102 during a touchdown with a probe in a probe die group that does not contact a die 102 during the touchdown. FIG. 6 illustrates an example.

Before turning to FIG. 6, however, it is noted that during touchdown 454 (illustrated in FIG. 4B), dies B1-18 can be contacted by probe die groups A, G, H, M-O, S-U, Y, Z, AA, BB, and EE-II (compare FIGS. 3 and 4B). Probe die groups B-F, I-J, P-R, V-X, CC, DD, and JJ, however, will not contact a die during touchdown 454 (compare FIGS. 3 and 4B). This is because probe die groups B-F, I-J, P-R, V-X, CC, DD, and JJ are outside of the boundary 104 of the die area 106 (the area on wafer 100 where dies 102 are intended to be made) in touchdown 454. Of the probe die groups CC, DD, II, and JJ discussed above with respect to FIG. 5, only probe die group II contacts a die (die B18). Probe die groups CC, DD, and JJ are outside the die area 106 (whose boundary is labeled 104 in FIG. 6) and thus do not contact a die 102 of wafer 100. It is uncertain what, if anything, the probes 224 of probe die groups CC, DD, and JJ contact during touchdown 454. Indeed, probes 224 in probe die groups CC, DD, and JJ could contact anything. If a probe 224 in probe die group CC, DD, or JJ that is connected to shared channel 204Bv contacts a structure on which there is an errant voltage or ground, that errant voltage or ground can appear on the probe 224 in probe die group II that is connected to shared channel 204Bv and can thus connect the errant voltage or ground to die B18, which can cause die B18 to falsely test as a bad die. Such a scenario is particularly troublesome outside of the die area 106 on wafer 102 but near the boundary 104 of the die area 106. This is because the process of manufacturing dies on a wafer can result in the partial manufacture of dies near the boundary 104 of the die area 106. Thus, probes 224 in probe die groups CC, DD, or JJ could contact a partially formed die and shared channel 204Bv could electrically connect the partially formed die to die B18, which could cause die B18 to malfunction and thus falsely test as bad.

Figure 7:
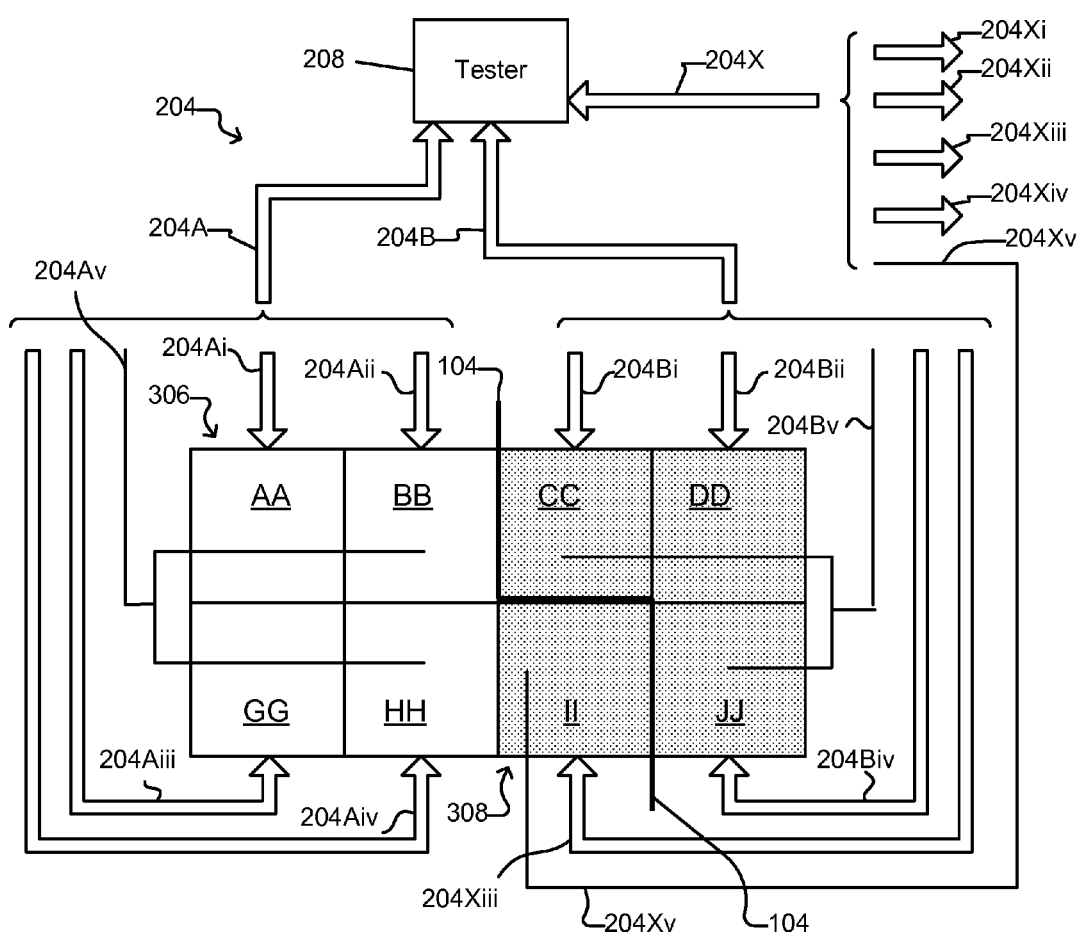
FIG. 7 illustrates a prior art solution for solving the problem illustrated in FIG. 6.

A solution for the foregoing problem is to separate probe die group II (which contacts an actual die B18) from probe die groups CC, DD, and JJ (which do not contact an actual die). For example, common communications channel 204Bv can be disconnected from the probe 224 in probe die group II, and that probe 224 in probe die group II can be connected to a different channel 204 that carries the same signal. FIG. 7 illustrates an example.

As shown in FIG. 7, common communications channel 204Bv can be disconnected from probe die group II and is thus connected only to probe die groups CC, DD, and JJ. The common communications channel 204Xv of the unused set 204X of channels 204 can be connected to probe die group II. This solves the problem illustrated in FIG. 6 because common communications channel 204Bv does not now cross the die area 106 boundary 104, nor does common communications channel 204Xv. Moreover, dedicated channels 204Xiii of channel set 204X can be connected to probe die group II as shown. However, the foregoing is an inefficient use of tester channels 204 because dedicated channels 204Xi, 204Xii, and 204Xiv of channel set 204X cannot now be connected to any probe die group set (e.g., like 304, 306, 308) and used to test dies 102. This is because channel set 204X is incomplete without common communications channel 204Xv, which is now used by probe die group II and cannot be connected with dedicated channels 204Xi, 204Xii, 204Xiii, and 204Xiv to another probe die group set (e.g., like 304, 306, 308). In addition, dedicated channels 204Biii are unused. Thus, in effect, two channel sets 204B and 204X have been used (or otherwise made unavailable) to provide sufficient channel connections to the probe die group set 308 (probe die groups CC, DD, II, and JJ). The use of two channel sets 204B and 204X for one probe die group set 308 is inefficient. Some embodiments of the present invention can solve the foregoing and/or other problems.

Figure 8:
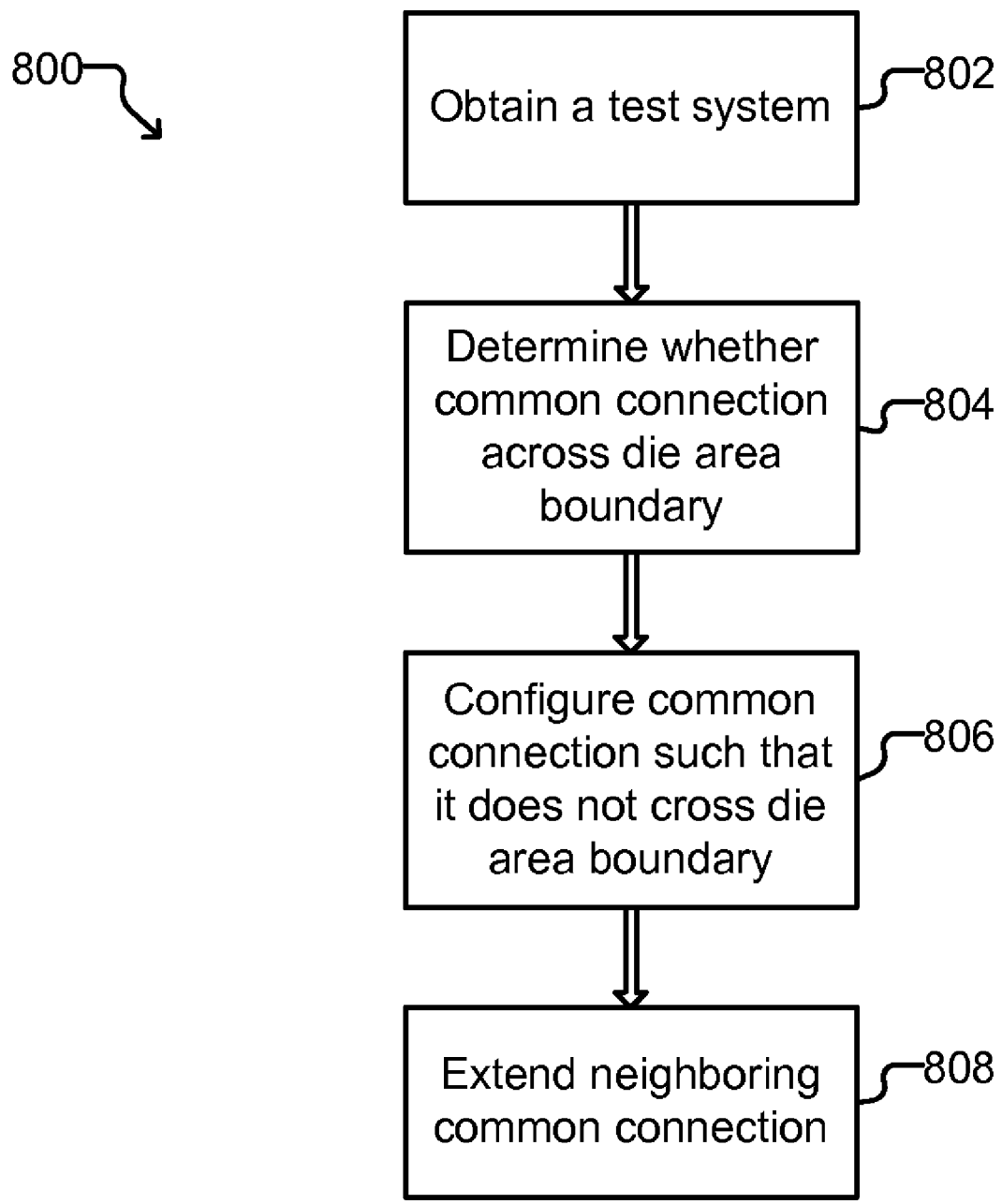
FIG. 8 illustrates an exemplary process according to some embodiments of the invention for connecting a common communications channel to probe die groups of the probe card assembly.

FIG. 8 illustrates an exemplary process 800 for configuring probe die group sets (e.g., like 306 and 308) such that a common communications channel (e.g., like 204Bv) is not shared across a boundary (e.g., like boundary 104) of the die area 106 on a wafer (e.g., like wafer 100). For ease of illustration and discussion, the process 800 will be described with respect to probe die group set 306 (probe die groups AA, DD, GG, and HH) and probe die group set 308 (probe die groups CC, DD, II, and JJ). The process 800 is not, however, so limited.

A test system can be obtained or provided at 802. The test system obtained or provided at 802 can be configured to control testing of sets of "N" dies through sets of commonly controlled probe die groups in which each probe die group is configured with sufficient probes to contact one of the dies. For example, as discussed above with respect to FIG. 5, system 200 can be configured such that a channel set 204A is connected to a probe die group set 306 of "N" (four in the example of FIG. 5) probe die groups AA, BB, GG, and HH, each comprising sufficient probes 224 to contact one of the dies 102. System 200 can also be configured such that another channel set 204B is connected to another probe die group set 308 of "N" (four in the example of FIG. 5) probe die groups CC, DD, II, and JJ. As also discussed above, tester 208 can be configured to control testing through channel set 204A and probe die group set 306 (and thus the M=four dies 102 contacted by probe die group set 306) as a logical whole. That is, tester 208 cannot provide or monitor test signals on one or more channels 204 in channel set 204A without also providing or monitoring test signals on the other channels 204 in channel set 204A. Similarly, tester 208 can be configured to control testing through channel set 204B and probe die group set 308 (and thus the M=four dies 102 contacted by probe die group set 308) as a logical whole. That is, tester 208 cannot provide or monitor test signals on one or more channels 204 in channel set 204B without also providing or monitoring test signals on the other channels 204 in channel set 204B. Tester 208 must thus test the M=four dies 102 contacted by probe die group set 306 as a set. That is, tester 208 cannot separately control testing of the individual dies 102 contacted by probe die group set 306, but must test those dies 102 simultaneously. Similarly, tester 208 must thus test the M=four dies 102 contacted by probe die group set 308 as a set. That is, tester 208 cannot separately control testing of the individual dies 102 contacted by probe die group set 308, but must test those dies 102 simultaneously. Because the tester paradigm is designed to treat the probe die groups as a set, any provision of signals or sharing of signals between probe die groups would be greatly counterintuitive.

A layout of the probe card assembly can be determined based on the configuration of the system 200 (e.g., the manner, as discussed above, that the tester 208 is configured to control channels 204) and the layout of dies 102 on wafer 100. It can then be determined at 804 whether a touchdown of probes of a probe card assembly of the test system will result in a commonly controlled set of the probe die groups crossing a boundary 104 of the die area 106 on the wafer. For example, as illustrated in FIG. 6, a touchdown 454 (see FIG. 4B) of probe card assembly 202 on wafer 102 can result in set 308 of probe die groups CC, DD, II, and JJ crossing a boundary 104 of the die area 106 of wafer 100.

Figure 9:
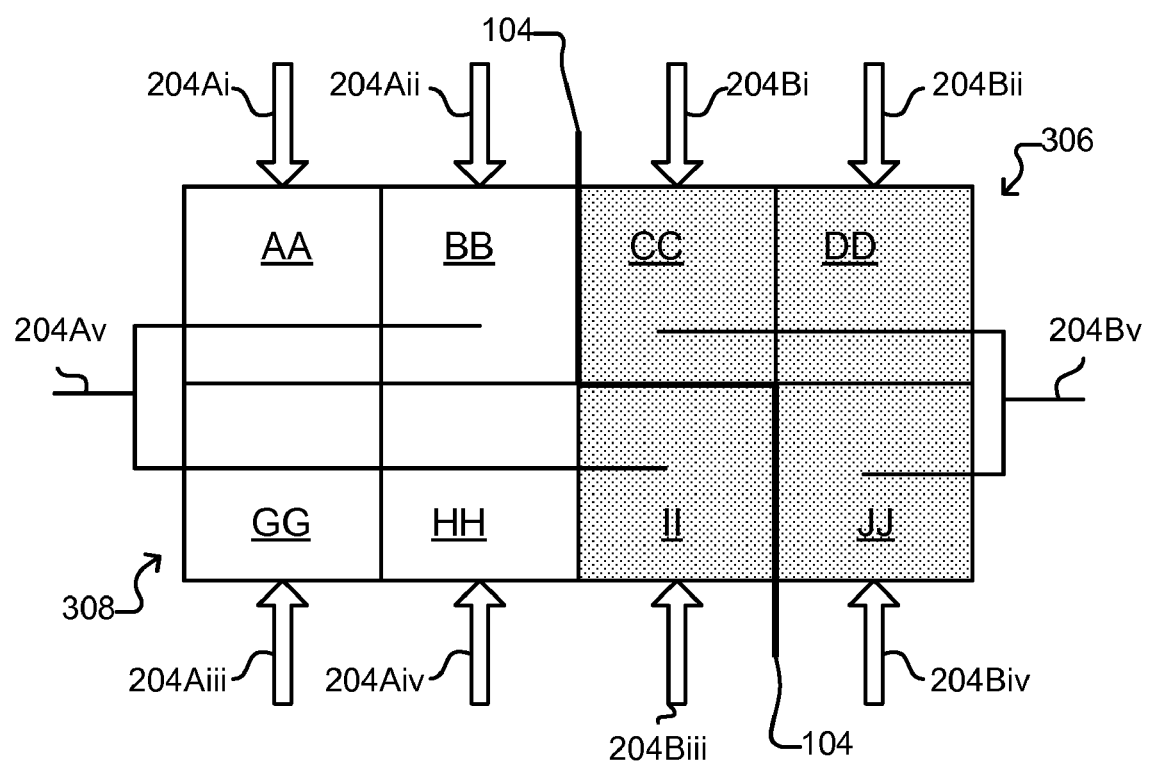
FIG. 9 illustrates an exemplary application of the process of FIG. 8 according to some embodiments of the invention.

Referring again to FIG. 8, at 806, common connections between probes in different probe die groups of the commonly controlled set of probe die groups are configured so that a common connection does not cross the boundary of the die area 106 on the wafer. As illustrated in FIG. 6, common communications channel 204Bv is connected to probes in each of probe die groups CC, DD, II, and JJ of probe die group set 308 and thus crosses the boundary 104 of the die area 106 on wafer 102. As illustrated in FIG. 9, common communications channel 204Bv can be made or modified such that it does not cross the boundary 104. In the example shown in FIG. 9, common communications channel 204Bv is connected only to probes in probe die groups CC, DD, and JJ of probe die group set 308.

Referring again to FIG. 8, at 808, a similar common connection between probes in different probe die groups of a neighboring commonly controlled set of probe die groups is extended from the neighboring commonly controlled set of probe die groups. As illustrated in FIG. 9, common communications channel 204Av is extended from probe die group set 306 to probe die group II, which as mentioned, is part of probe die group set 308. Common communications channel 204Av is thus extended utilized to provide signals to probes 224 not only in the probe die groups AA, BB, GG, and HH of probe die group set 306 but also probe die group II in probe die group set 308. One or more of steps 802, 804, 806, and 808 can be repeated as many times is desired.

Figure 10:
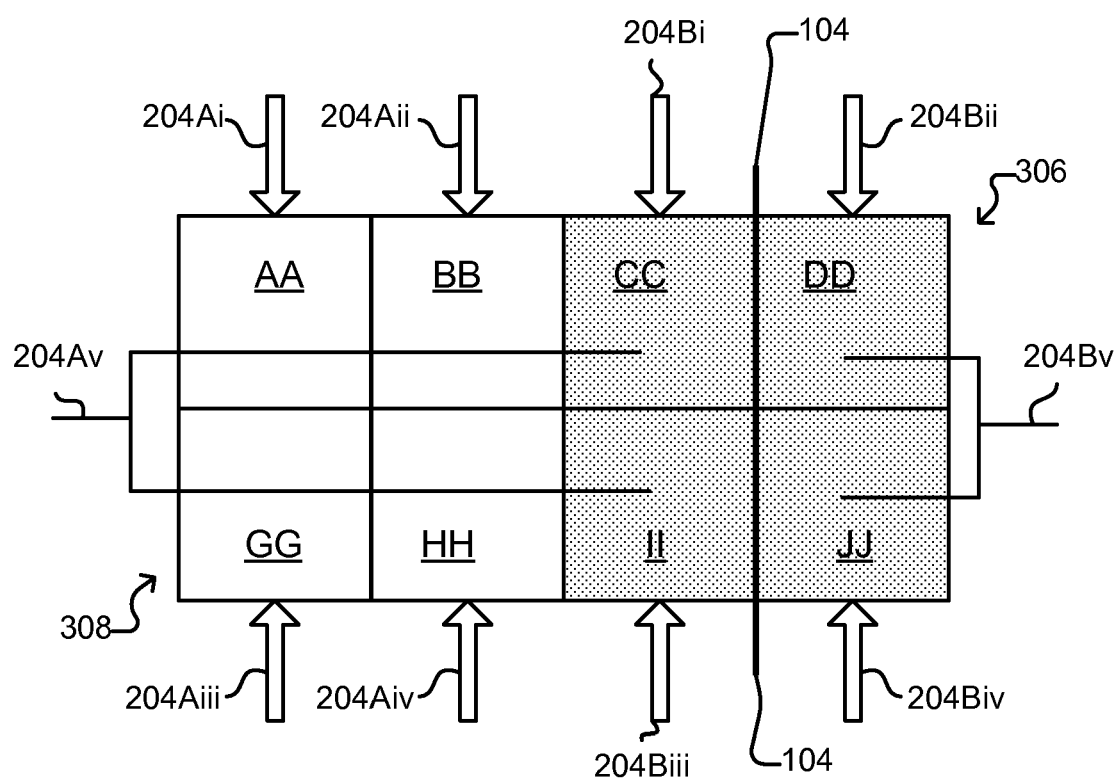
FIG. 10 illustrates another exemplary application of the process of FIG. 8 according to some embodiments of the invention.

The example in FIG. 9 is exemplary only, and many variations are possible. For example, FIG. 10 illustrates a non-limiting example in which the boundary 104 on wafer 100 passes between probe die groups CC and II, on one hand, and probe die groups DD and JJ, on the other hand, in probe die group set 308. In such a case, common communications channel 204Bv can be connected only to probe die groups DD and JJ in probe die group set 308 as shown in FIG. 10. Common communications channel 204Av to probe die groups AA, BB, GG, and HH in probe die group set 306 can be extended to probe die groups CC and II in probe die group set 308 as shown in FIG. 10. While testing dies 102, tester 208 can provide the same signal type on the common communications channels, including common communications channel 204Av and common communications channel 204Bv.

With some of the probes 224 of the probe card assembly 202 of FIG. 2 configured as shown in FIG. 9 or 10, test system 200 (see FIG. 2) can be configured to test dies 102 of wafer 100 as follows. As shown in FIG. 2, communications channels 204 can connect to the tester 208 and to tester connections 220 (which can be a non-limiting example of an interface to communications channels) of probe card assembly 202. Tester connections 220 can comprise individual connections to each of channels 204. As shown in FIGS. 9 and 10, the communications channels 204 can include channel set 204A (which can be a non-limiting example of second communications channels) and channel set 204B (which can be a non-limiting example of first communications channels).

Moreover, channel set 204A can include dedicated communications channels 204Ai, 204Aii, 204Aiii, and 204Aiv (which can be non-limiting examples of second dedicated communications channels) and common communications channel 204Av (which can be a non-limiting example of a second common communications channel). Channel set 204B can include dedicated communications channels 204Bi, 204Bii, 204Biii, and 204Biv (which can be non-limiting examples of first dedicated communications channels) and common communications channel 204Bv (which can be a non-limiting example of a first common communications channel).

Dedicated communications channels 204Ai, 204Aii, 204Aiii, 204Aiv, 204Bi, 204Bii, 204Biii, and 204Biv can be electrically connected to individual probes 224 in probe die groups AA, BB, CC, DD, GG, HH, II, and JJ by electrical connections (e.g., like electrical connections 216 in FIG. 2) to tester connections 220. Moreover, common communications channel 204Bv (which as mentioned above can be a non-limiting example of a first common communications channel) can be electrically connected from tester connections 220 through probe card assembly (e.g., by electrical connections like 216) to a probe in two or more ("X") of the probe die groups CC, DD, JJ, or II in die probe group set 306 but not connected to any probe in at least one ("Y") of the probe die groups CC, DD, JJ, or II in die probe group set 306. (Electrical connections 216 can be non-limiting examples of dedicated and common electrical paths between individual connections to individual channels 204 in tester connections 220 and one or more probes 224.) In the non-limiting example in FIG. 9, "X" is 3 and corresponds to probe die groups CC, DD, and JJ, and "Y" is 1 and corresponds to probe die group II. In the non-limiting example in FIG. 10, "X" is 2 and corresponds to probe die groups DD and JJ, and "Y" is 2 and corresponds to probe die groups CC and II. Common communications channels 204Av (which as mentioned above can be a non-limiting example of a second common communications channel) can be electrically connected from tester connections 220 (see FIG. 2) through probe card assembly (e.g., by electrical connections like 216) to a probe in each of probe die groups AA, BB, GG, and HH in die probe group set 308 and to probe(s) in the at least one ("Y") of the probe die groups CC, DD, JJ, or II in die probe group set 306 that common communications channel 204Bv was not connected to. As mentioned, in the non-limiting example in FIG. 9, "Y" is 1 and corresponds to probe die group II. In the non-limiting example in FIG. 10, "Y" is 2 and corresponds to the probe die groups CC and II.

During a touchdown of probes 224 of probe card assembly 202 on wafer 100 as illustrated in FIG. 2, tester 208 can control testing of dies 102, if any, contacted by probes 224 of the probe die groups of probe die group sets 306 and 308 as well as probes 224 of other probe die groups 302 (see, e.g., FIG. 3) of probe card assembly 202. As discussed above, tester 208 can be configured to control testing through probe die group sets (e.g., 304, 306, 308) as a logical whole as defined above. For example, during touchdown 454 shown in FIG. 4B, tester 208 can control testing through probe die group set 308 (see FIG. 9) as a logical whole by controlling the provision of test signals (which can be non-limiting examples of second test signals) through channel set 204A to probe die group set 308 (which, as mentioned above, can be a non-limiting example of a plurality of first probe die groups), and tester 208 can simultaneously control testing through probe die group set 306 (see FIG. 9) as a logical whole by controlling the provision of test signals (which can be non-limiting examples of first test signals) through channel set 204B to probe die group set 306 (which, as mentioned above, can be a non-limiting example of a plurality of first probe die groups).

The testing by the tester 208 can also include monitoring on one or more of the communications channels 204 expected response signals. For example, tester 208 can monitor one or more of dedicated communications channels in channel sets 204A and/or 204 for response test signals generated by a die 102 in response to one or more of the test signals provided by tester 208 through the communications channels 204 to dies 102. The tester 208 can compare such response test signals to expected response signals. If an expected response test signal is not received, the tester 208 can determine that one or more of the dies contacted by the probes 224 to which the channel set (e.g., 204A or 204B) is connected failed the testing. A default configuration of tester 208 may be to stop mid-test the testing of those dies by, for example, stop providing test signals to the channel set (e.g., 204A or 204B) on which the unexpected response test signal was detected. In some embodiments, tester 208 can be reconfigured to continue such testing by continuing to control as a logical whole the provision of test signals through a channel set (e.g., 204A or 204B) even if an unexpected response test signal is detected on one of the channels of the channel set.

For example, as discussed above, tester 208 can provide test signals through channel sets 204A and 204B in FIG. 9. Tester 208 can also monitor ones of the channels of channel sets 204A and/or 204B for response test signals that would be expected to be generated by dies 102 contacted by any of the probes 224 of probe die groups AA, BB, CC, DD, GG, HH, II, and/or JJ. Tester 208 can be configured to continue testing—as opposed to stopping the test—through channel sets 204A and 204B even if an expected response signal is not received or an unexpected response test signal is detected on one of the channels that indicates that a die 102 failed the testing. This can be important because, as shown in FIG. 9, dedicated channels 204Bi, 204Bii, and 204Biv are connected to probe die groups CC, DD, and JJ that, in the example shown in FIG. 9, are outside the die area 106 defined by boundary 104 (see FIG. 1). For this reason, correct response test signals are unlikely to be detected on any of the channels of dedicated channels 204Bi, 204Bii, and 204Biv during a particular test. However, the probes 224 of probe die group II are located within die area 104 defined by boundary 106 (see FIG. 1) and are thus presumably in contact with a fully manufactured die 102. If tester 208 were to stop testing through channel set 204B upon detecting that expected response test signals were not detected on any of dedicated communications channels 204Bi, 204Bii, 204Biv, testing of the die 102 contacted by the probes of die group II would also be stopped and that die would be identified as failing the test regardless of whether it is a good or a bad die. For this reason, it can be advantageous to configure tester 208 to continue testing even if expected response test signals are not detected on some of dedicated channels 204Bi, 204Bii, and 204Biv. Alternatively, tester 208 can be configured not to monitor or to disregard response test signals on channels 204 known to be connected to probes 224 that are outside of the die area 106 defined by boundary 104. For example, in the example shown in FIG. 9, tester 208 can be configured to monitor response test signals on channels 204Biii but not to monitor or to disregard response test signals on channels 204Bi, 204Bii, and 204Biv during a particular test because channels 204Bi, 204Bii, and 204Biv are connected to probes 224 of probe die groups CC, DD, and JJ located outside die area 106 defined by boundary 104 (see FIG. 1).

As shown in FIG. 9 and discussed above, during touchdown 454 (see FIG. 4B), electrical connections (e.g., like 216 in FIG. 2) in probe card assembly 202 (see FIG. 2) can connect common communications channel 204Av (which as discussed above, can be a non-limiting example of a second common communications channel) only to probes in probe die groups AA, BB, GG, HH, and II that are located entirely within die area 106 (see FIG. 1) bounded by boundary 104. In contrast, electrical connections (e.g., like 216 in FIG. 2) in probe card assembly 202 (see FIG. 2) can connect common communications channel 204Bv only to probes in probe die groups CC, DD, and JJ that are located entirely outside of die area 106 (see FIG. 1) bounded by boundary 104. In contrast to the foregoing, during touchdown 460 illustrated in FIG. 4D, the probes in probe die groups AA, BB, GG, HH, and II are located entirely outside die area 106 (see FIG. 1) bounded by boundary 104, and probes in probe die groups CC, DD, and JJ are located entirely within of die area 106 (see FIG. 1) bounded by boundary 104 (e.g., probes in probe die groups CC, DD, and JJ contact dies E16, E17, and E18 during touchdown 460). In fact, during each of touchdowns 452, 454, 456, 458, 460, and 462 in FIGS. 4A-4D, the probes in probe die groups AA, BB, GG, HH, and II are located either entirely inside or outside die area 106 (see FIG. 1) bounded by boundary 104, and probes in probe die groups CC, DD, and JJ are also located entirely inside or outside die area 106 (see FIG. 1) bounded by boundary 104.

Figure 11:
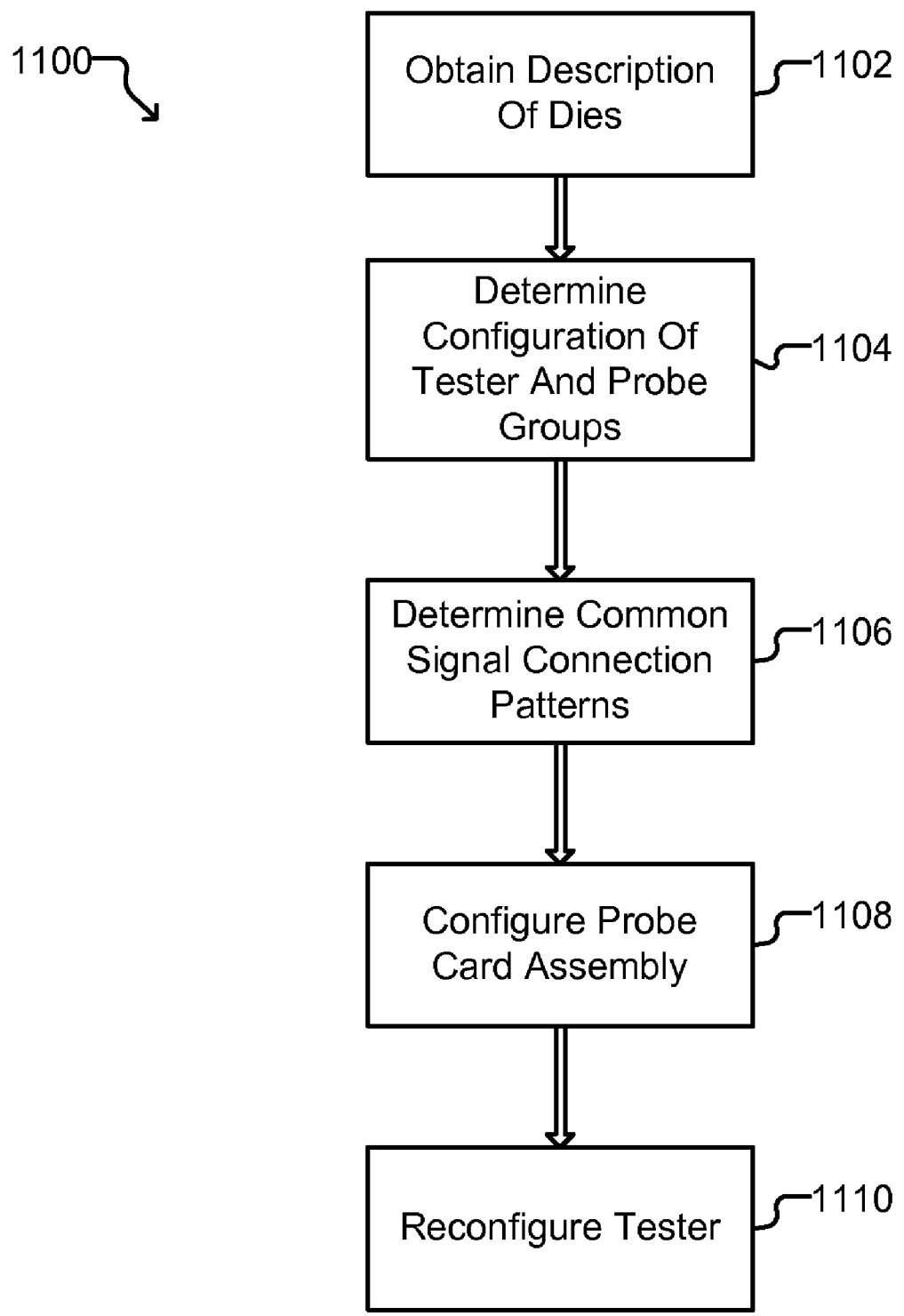
FIG. 11 illustrates an exemplary process according to some embodiments of the invention for connecting a common communications channel to probe die groups of the probe card assembly.

FIG. 11 illustrates an exemplary process 1100 for configuring a probe card assembly to share common communications channels without creating an electrical connection that crosses a die area 106 boundary 104 on the wafer. For ease of illustration and discussion, process 1100 is discussed with respect to exemplary wafer 100 of FIG. 1 and test system 200 including probe card assembly 202 of FIG. 2. Process 1100 is not, however, limited to use with wafer 100, test system 200, or probe card assembly 202.

A description of the dies to be tested can be obtained or determined at 1102. For example, a description of the number and layout of the dies on a wafer can be obtained at 1102. For example, the dies 102 of wafer 100 of FIG. 1 can be non-limiting examples of dies to be tested, and the layout or pattern of dies 102 on wafer 100 (e.g., as shown in FIG. 1) can be obtained or determined at 1102. At 1104, a description of the configuration of the tester and probes on a probe card assembly that will be used to test the dies can be obtained or determined. For example, it can be determined at 1104 that a probe card assembly 202 of FIG. 2 will be used to test the dies 102, and the probes 224 of probe card assembly 202 are organized or configured in probe die groups 302 as shown in FIG. 3. Moreover, it can be determined at 1104 that tester 208 is configured to provide and commonly control channel sets to "N" number of probe die groups for contacting "N" dies 102 as generally discussed above with respect to FIG. 5. For example, in a non-limiting example in which "N" is four, tester 208 can be configured to provide a channel set like 204A or 204B to each of a set of four probe die groups 302. For example, as discussed above with respect to FIG. 5, tester 208 can be configured to provide and commonly control a channel set like 204A, 204B, or 204X to each of the following sets of four probe die groups 302: A, B, G, and H; C, D, I, and J; E, F, K, and L; M, N, S, and T; O, P, U, and V; Q, R, W, and X; Y, Z, EE, and FF; AA, BB, GG, and HH; and CC, DD, II, and JJ.

Figure 12:
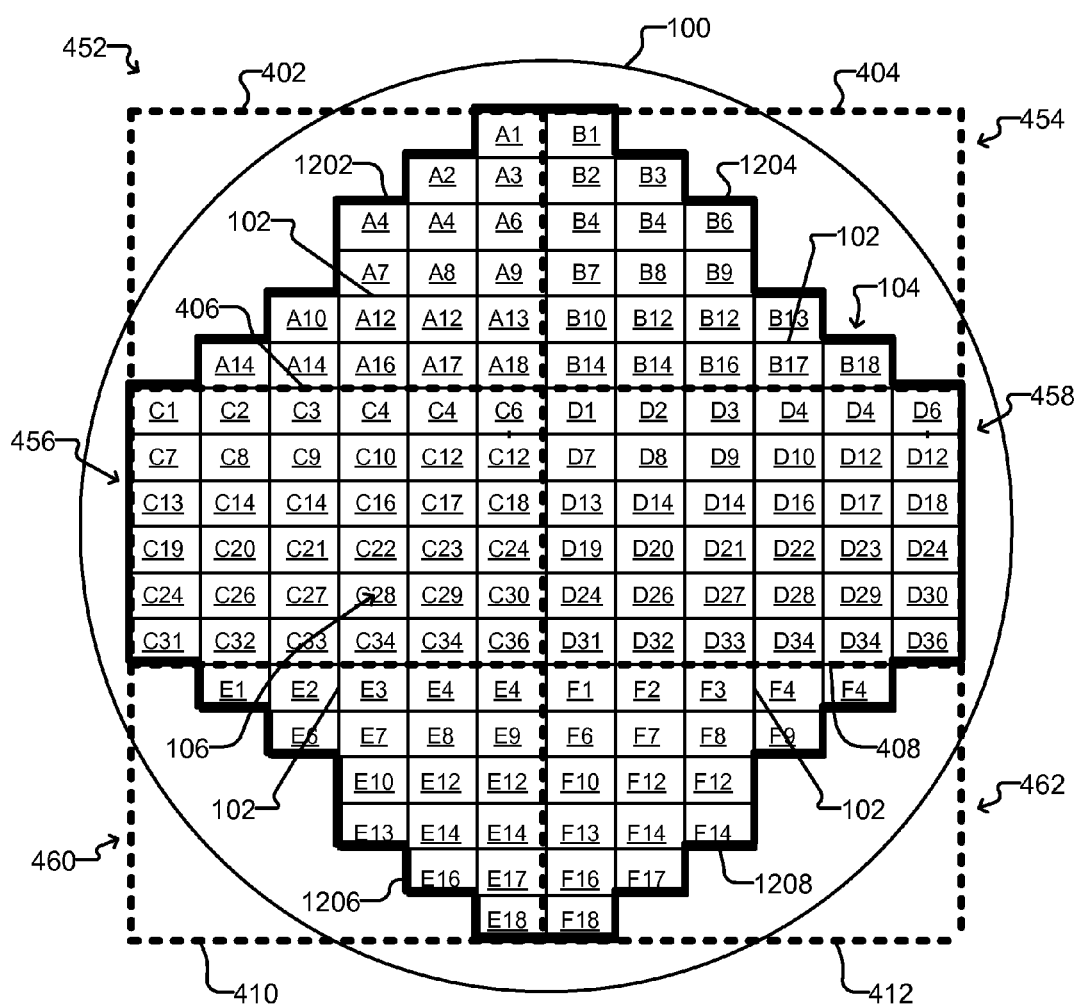

Referring again to FIG. 11, at 1106, the manner in which common communications channels (e.g., like 204Av, 204Bv, and 204Xv (see FIG. 5)) can be shared between probe die groups 302 such that a common communications channel is not shared across a die area 106 boundary (like 104) can be determined. FIGS. 12-15 illustrate a non-limiting technique for doing so. As shown in FIG. 12, the number and locations of touchdowns of the probe card assembly 202 on the wafer 100 to contact and test all of dies 102 on the wafer can be identified. In the non-limiting example shown in FIG. 12, six touchdowns 452, 454, 456, 458, 460, and 462 are identified, which can be the same as or similar to like numbered touchdowns shown in FIGS. 4A-4D. As discussed above, outlines 402, 404, 406, 408, 410, and 412 represent the locations of probe die groups 302 of probe card assembly 202 during each of the touchdowns 452, 454, 456, 458, 460, and 462.

Figure 13:
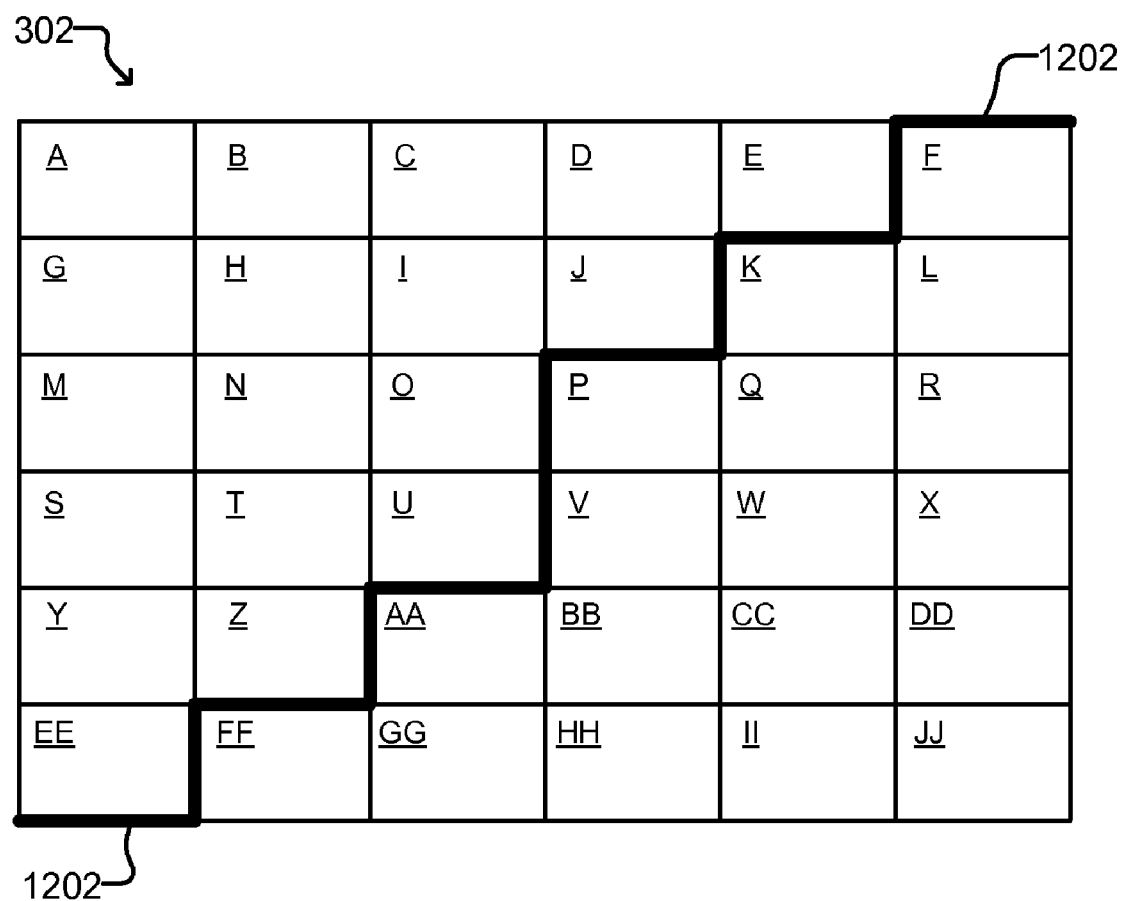
Figure 14:
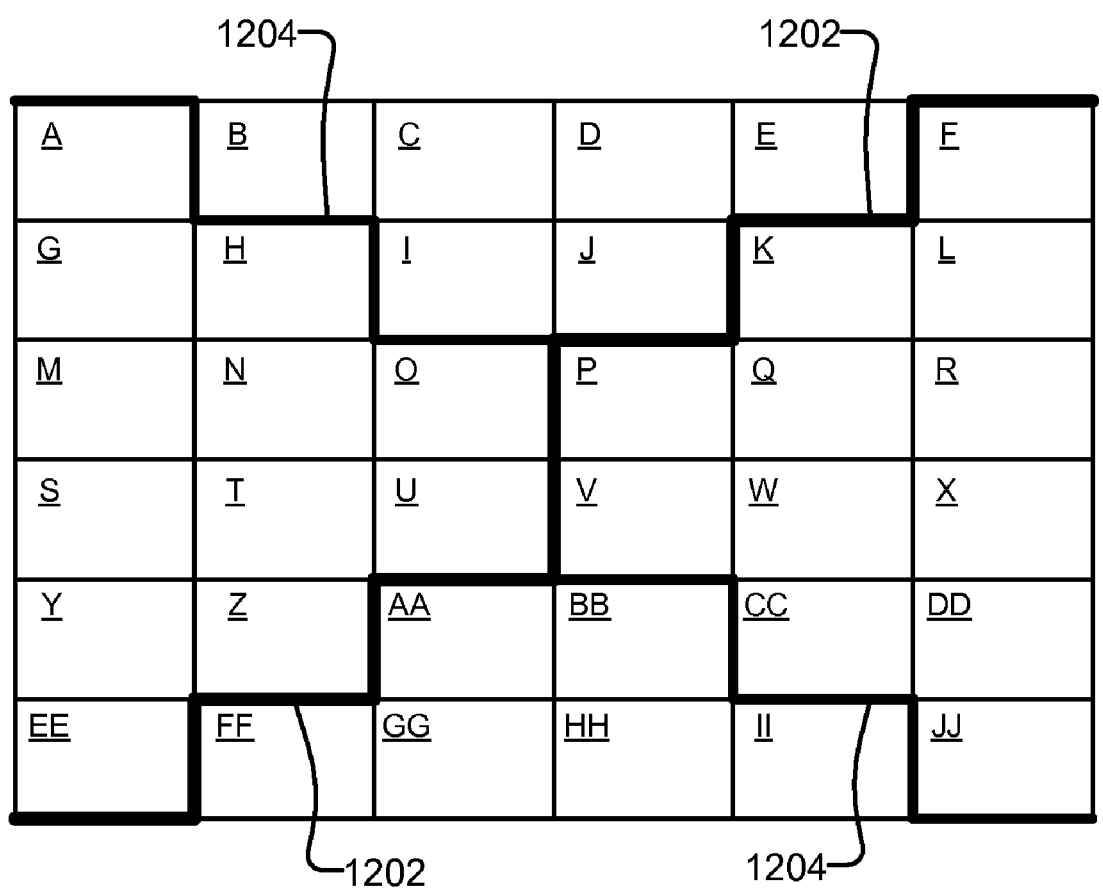

As shown in FIGS. 13-15 and also with reference to FIG. 12, portions of the boundary 104 of the die area 106 on wafer 102 can be superimposed onto a layout of probe die groups 302 for each touchdown. As can be seen in FIG. 12, boundary portions 1202, 1204, 1206, and 1208 can be parts of the boundary 104 of the die area 106 of wafer 102 that intersects the outline 402 of probe die groups 302 during touchdowns 452, 454, 460, and 460. In FIG. 13, boundary portion 1202—which, as can be seen in FIG. 12, can be the portion of die area 106 boundary 104 that intersects the outline 402 of probe die groups 302 during touchdown 452—can be superimposed on a layout of probe die groups 302. In FIG. 14, boundary portion 1204—which, as can be seen in FIG. 14, can be the portion of die area 106 boundary 104 that intersects the outline 404 of probe die groups 302 during touchdown 454—can be superimposed on a layout of probe die groups 302. As can be seen in FIG. 12, the boundary of die area 106 of wafer 102 does not intersect the outlines 406, 408 of touchdowns 456 or 458. There is therefore no portion of the boundary 104 of the die area 106 of wafer 102 associated with touchdowns 456 or 458, and no such boundary need be superimposed on the layout of probe die groups 302. Referring to FIGS. 12 and 15, the boundary portions 1206 and 1208 of boundary 104 of die area 106 on wafer 100 during touchdowns 460 and 462 (see FIG. 12), when superimposed on the layout of probe die groups 302 (see FIG. 15), are the same, respectively, as boundary portions 1204 and 1202.

Figure 16:
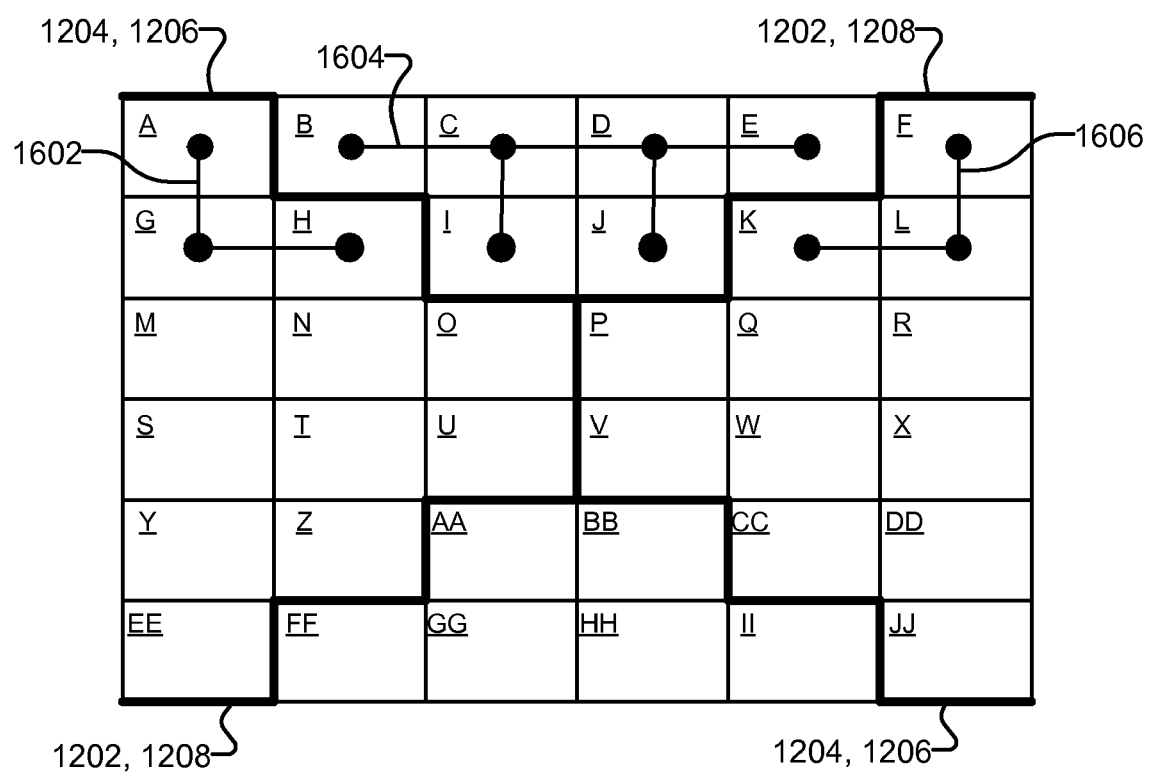
FIGS. 16-18 illustrate an example of providing electrical connections between probe die groups of the probe card assembly according to some embodiments of the invention.
Figure 17:
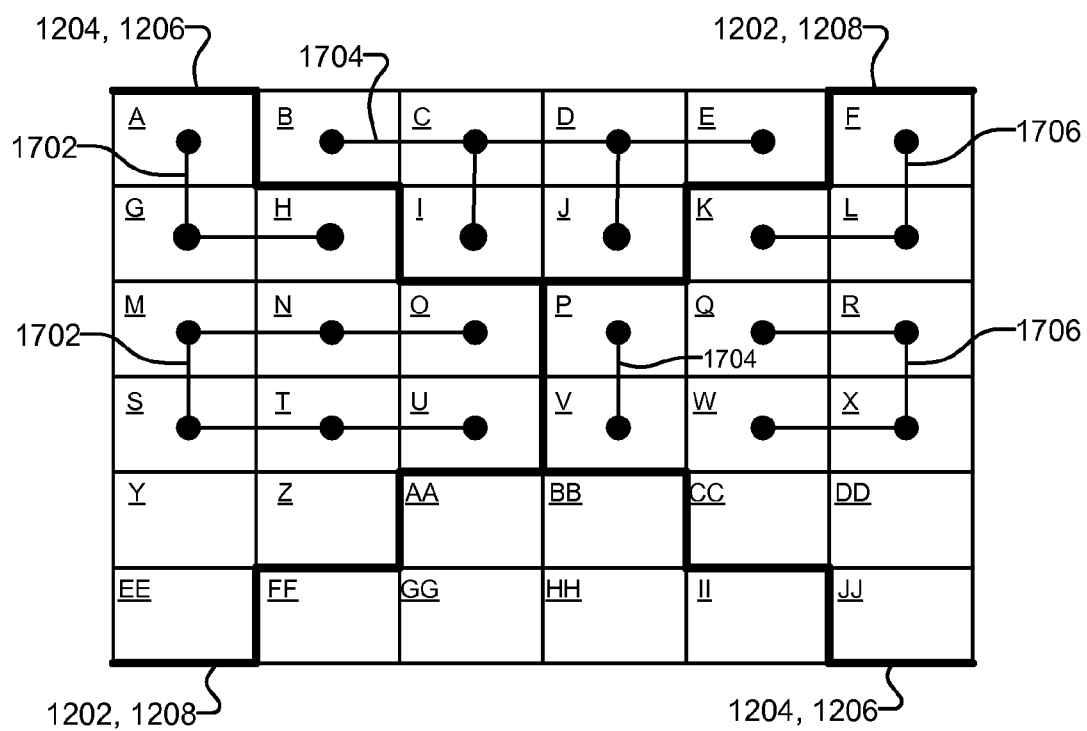
Figure 18:
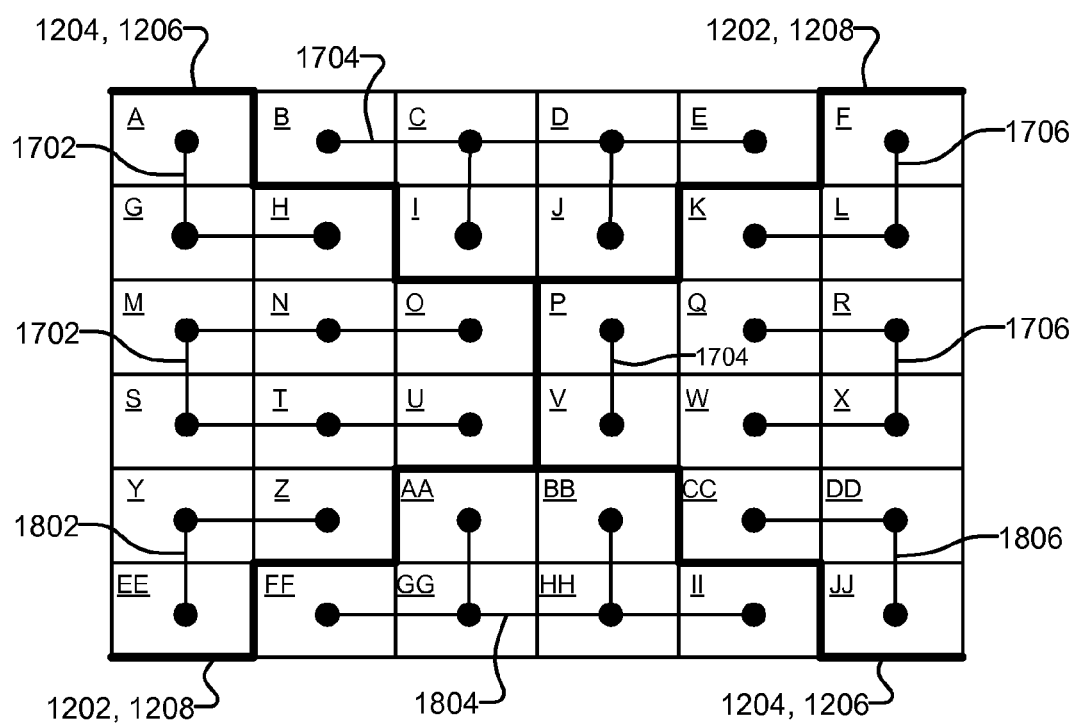

FIGS. 16-18 illustrate providing electrical connections between probe die groups 302 to share common communications channels (e.g., like 204Av, 204Bv, or 204Xv) without creating an electrical connection that crosses any of the superimposed die area 106 boundary portions 1202, 1204, 1206, or 1208.

As discussed above, probe die groups A, B, G, and H can be a commonly controlled probe die group set and can be connected to a channel set like channel set 204A, 204B, or 204X. An electrical connection 1604 among probe die groups A, G, and H can be provided to share a connection to a common communications channel (e.g., like common communications channel 204Av) among probes in probe die groups A, G, and H without crossing a boundary portion 1202, 1204, 1206, or 1208. As also discussed above, probe die groups E, F, K, and L can be a commonly controlled probe die group set that is connected to a channel set like channel set 204A, 204B, or 204X. An electrical 1606 connection among probes of probe die groups F, K, and L can be provided to share a connection to a common communications channel (e.g., like common communications channel 204Av) among probe die groups F, K, and L without crossing a boundary portion 1202, 1204, 1206, or 1208. Probe die groups C, D, I, and J can also be a commonly controlled probe die group set that is connected to a channel set like channel set 204A, 204B, or 204X. An electrical connection 1604 among probes of probe die groups C, D, I, and J can be provided to share a connection to a common communications channel (e.g., like common communications channel 204Av) among probe die groups C, D, I, and J without crossing a boundary portion 1202, 1204, 1206, or 1208. Moreover, connection 1604 can be extended to probe die group B and probe die group E to supply the common communications channel to those probe die groups without crossing a boundary portion 1202, 1204, 1206, or 1208. Tester 208 can provide a same or similar test signal type on the common communications channels connected to connections 1604, 1604, and 1606. Each of connections 1604, 1604, and 1606 can be implemented as an electrical connection 216 through probe card assembly 202 that connects a connection in connector 220 to a common communications channel (e.g., line common communications channel 204Av) to multiple probes 224 (see FIG. 2). For example connection 1604 can connect a connection to a common communications channel in connector 220 to a probe 224 in each of probe die groups A, G, and H.

Turning now to FIG. 17, probe die groups O, P, U, and V can be a commonly controlled probe die group set that is connected to a channel set like channel set 204A, 204B, or 204X. An electrical connection 1704 between probes in probe die groups P and V can be provided to share a connection to a common communications channel (e.g., like common communications channel 204Av) between probe sets P and V without crossing a boundary portion 1202, 1204, 1206, or 1208. Probe die groups M, N, S, and T can also be a commonly controlled probe die group set that is connected to a channel set like channel set 204A, 204B, or 204X. An electrical connection 1702 among probe die groups M, N, S, and T can be provided to share a connection to a common communications channel (e.g., like common communications channel 204Av) among probe die groups M, N, S, and T without crossing a boundary portion 1202, 1204, 1206, or 1208. Moreover, connection 1702 can be extended to probe die groups O and U to supply a connection to the common communications channel to those probe die groups without crossing a boundary portion 1202, 1204, 1206, or 1208. Probe die groups Q, R, W, and X can be a commonly controlled probe die group set that is connected to a channel set like channel set 204A, 204B, or 204X. An electrical connection 1706 among probe die groups Q, R, W, and X can be provided to share a connection to a common communications channel (e.g., like common communications channel 204Av) among probe die groups Q, R, W, and X without crossing a boundary portion 1202, 1204, 1206, or 1208. Tester 208 can provide a same or similar test signal type on the common communications channels connected to connections 1702 and 1704 and 1706 as well. Each of connections 1702, 1704, and 1706 can be implemented as an electrical connection 216 through probe card assembly 202 that connects a connection in connector 220 to a common communications channel (e.g., line common communications channel 204Av) to multiple probes 224 (see FIG. 2). For example connection 1702 can connect a connection to a common communications channel in connector 220 to a probe 224 in each of probe die groups M, N. O. S, T, and U.

Turning to FIG. 18, as discussed above, probe die groups Y, Z, EE, and FF can be a commonly controlled probe die group set that is connected to a channel set like channel set 204A, 204B, or 204X. An electrical connection 1802 among probe die groups Y, Z, and EE can be provided to share a connection to a common communications channel (e.g., like common communications channel 204Av) among probes in probe die groups Y, Z, and EE without crossing a boundary portion 1202, 1204, 1206, or 1208. As also discussed above, probe die groups CC, DD, II, and JJ can be a commonly controlled probe die group set that is connected to a channel set like channel set 204A, 204B, or 204X. An electrical connection 1806 among probes in probe die groups CC, DD, and JJ can be provided to share a connection to a common communications channel (e.g., like common communications channel 204Av) among probe die groups CC, DD, and JJ without crossing a boundary portion 1202, 1204, 1206, or 1208. Probe die groups AA, BB, GG, and JJ can also be a commonly controlled probe die group set that is connected to a channel set like channel set 204A, 204B, or 204X. An electrical connection 1804 among probe die groups AA, BB, GG, and JJ can be provided to share a connection to a common communications channel (e.g., like common communications channel 204Av) among probes of probe die groups AA, BB, GG, and JJ without crossing a boundary portion 1202, 1204, 1206, or 1208. Moreover, connection 1804 can be extended to probe die group FF and probe die group II to supply the common communications channel to those probe die groups without crossing a boundary portion 1202, 1204, 1206, or 1208. Tester 208 can provide a same or similar test signal type on the common communications channels connected to connections 1802, 1804, and 18061. Each of connections 1802, 1804, and 1806 can be implemented as an electrical connection 216 through probe card assembly 202 that connects a connection in connector 220 to a common communications channel (e.g., line common communications channel 204Av) to multiple probes 224 (see FIG. 2). For example connection 1804 can connect a connection to a common communications channel in connector 220 to a probe 224 in each of probe die groups AA, BB, FF, GG, HH, and II.

Configured as shown in FIG. 18, none of connectors 1604, 1604, 1606, 1702, 1704, 1706, 1802, 1804, and 1806 cross a boundary portion 1202, 1204, 1206, or 1208 of the die area 106 of wafer 100 during any of the touchdowns 452, 454, 456, 458, 460, or 462 illustrated in FIG. 12. The communications channels to which connectors 1604, 1604, 1606, 1702, 1704, 1706, 1802, 1804, and 1806 are connected can be non-limiting examples of first or second common communications channels, and the probes to which connectors 1604, 1604, 1606, 1702, 1704, 1706, 1802, 1804, and 1806 are connected can be non-limiting examples of first or second probes. Also, connectors 1604, 1604, 1606, 1702, 1704, 1706, 1802, 1804, and 1806 are non-limiting examples in which all of first or second probes connected to the connector—and thus to the common channel to which the connector is connected—are located entirely inside or outside a die area (e.g., 106 in FIG. 1) on a wafer.

Referring again to process 1100 of FIG. 11, at 1110, tester 208 can be reconfigured or reprogrammed as desired or needed to control testing of dies 102 with the connectors 1604, 1604, 1606, 1702, 1704, 1706, 1802, 1804, and 1806 interconnecting probe die groups 302. For example, if the tester 208 is configured to stop mid-test the testing of a group of dies through a probe die group set (e.g., set A, B, G, and H; set C, D, I, and J; set E, F, K, and L; set M, N, S, and T; set O, P, U, and V; set Q, R, W, and X; set Y, Z, EE, and FF; set AA, BB, GG, and HH; and/or set CC, DD, II and JJ in FIG. 18) if the tester determines that one of the dies contacted by one of the probe die group set has failed the testing, the tester 208 can be reconfigured at 1110 to complete the testing even if the tester detects that a die contacted by the probe die group set failed the testing. As an alternative, the tester 208 could be reconfigured simply not to monitor response test signals on certain communications channels. That is, tester 208 can be reconfigured such that it does not monitor response signals on communications channels known to be connected to a probe die group that is aligned with a location outside of boundary 104 on wafer 100.

Dies 102 of wafer 100 can be tested by bringing probes of probe die groups 302 into contact with dies 102 in the sequence of touchdowns 452-462 illustrated in FIG. 12. During each touchdown 452-462, the tester 208 can provide test signals through channel sets as discussed above to the dies 102 contacted during the touchdown, and the tester 208 can monitor through the channel sets test signals generated by the dies 102 to determine whether the dies 102 function correctly and pass the testing. As discussed above, the tester 208 can be configured such that it does not stop mid-test the testing through a channel set even if it determines that a die contacted by a probe die group connected to the channel set has failed the testing. Alternatively, the tester 208 can simply not monitor or can disregard response test signals on communications channels known to be connected to a probe die group that is aligned with a location outside boundary 104 on wafer 100.

Although specific embodiments and applications of the invention have been described in this specification, there is no intention that the invention be limited these exemplary embodiments and applications or to the manner in which the exemplary embodiments and applications operate or are described herein.

What is claimed is:

1. A process of testing a plurality of semiconductor dies on a semiconductor wafer utilizing a tester configured to test the dies in groups, the process comprising:

controlling as a logical whole provision of first test signals through a plurality of first communications channels to first probes organized into a plurality of N first probe die groups each configured to contact a different one of the dies of the wafer, wherein one of the first communications channels is a first common communications channel connected to probes in X of the N first probe die groups but not to probes in Y of the N first probe die groups, wherein X is at least two and Y is at least one; and controlling as a logical whole provision of second test signals through a plurality of second communications channels to second probes organized into a plurality of second probe die groups each configured to contact a different one of the dies of the wafer, wherein one of the second communications channels is a second common communications channel connected to probes in all of the second probe die groups and probes in each of the Y of the first probe die groups;

wherein the first communications channels comprise a plurality of first dedicated communications channels each connected to one or more of the first probes in only one of the first probe die groups; and wherein the second communications channels comprise a plurality of second dedicated communications channels each connected to one or more of the second probes in only one of the second probe die groups.

2. The process of claim 1, wherein the first dedicated communications channels, the first common communications channel, the second dedicated communications channels, and the second common communications channel are connected to the first probes and the second probes through a probe card assembly, and the first probes and the second probes are part of the probe card assembly.

3. The process of claim 2, wherein:

the dies are part of an unsingulated semiconductor wafer; and the controlling as a logical whole the provision of first test signals and the controlling as a logical whole the provision of second test signals are performed simultaneously during one touchdown of probes of the probe card assembly onto the wafer.

4. The process of claim 3, wherein during the one touchdown:
all of the one(s) of the first probes and all of the ones of the second probes connected to the second common channel contact dies located within a die area on the wafer in which fully formed dies are intended to be made on the wafer; and
none of the ones of the first probes connected to the first common channel contact dies located within the die area on the wafer.

5. The process of claim 3, wherein during the one touchdown:
all of the ones of the first probes connected to the first common channel contact dies located within a die area on the wafer in which fully formed dies are intended to be made on the wafer; and
none of the one(s) of the first probes and the ones of the second probes connected to the second common channel contact dies located within the die area on the wafer.

6. The process of claim 3 further comprising repeating the controlling as a logical whole the provision of first test signals and the controlling as a logical whole the provision of second test signals a plurality of times for a plurality of touchdowns of probes of the probe card assembly onto the wafer,
wherein during each of the plurality of touchdowns:
either all of the one(s) of the first probes and all of the ones of the second probes connected to the second common channel contact dies located within a die area on the wafer in which fully formed dies are intended to be made on the wafer or none of the one(s) of the first probes and the ones of the second probes connected to the second common channel contact dies located within the die area on the wafer; and
either all of the ones of the first probes connected to the first common channel contact dies located within the die area on the wafer or none of the ones of the first probes connected to the first common channel contact dies located within the die area on the wafer.

7. The process of claim 1 further comprising:
monitoring ones of the first communications channels for expected response test signals; and
continuing the controlling as a logical whole the provision of first test signals and the controlling as a logical whole the provision of second test signals even if one of the expected response test signals indicates a die failure.

8. The process of claim 1, wherein the controlling as a logical whole the provision of first test signals and the controlling as a logical whole the provision of second test signals are performed simultaneously.

9. A process of testing a plurality of semiconductor dies on a semiconductor wafer utilizing a tester configured to test the dies in groups, the process comprising:
receiving at a probe card assembly first test signals through a plurality of first communications channels, the first test signals for testing as a logical whole a first group of N of the dies, wherein one of the first communications channels is a first common communications channel;
receiving at the probe card assembly second test signals through a plurality of second communications channels, the second test signals for testing as a logical whole a second group of the dies, wherein one of the second communications channels is a second common communications channel;
providing the first test signals through the probe card assembly to first probes of the probe card assembly, the first probes organized into a plurality of N first probe die groups each configured to contact a different one of the dies, wherein a test signal received on the first common communications channel is provided to probes in X of the N first probe die groups but not to probes in Y of the N first probe die groups, wherein X is at least two and Y is at least one; and
providing the second test signals through the probe card assembly to second probes of the probe card assembly, the second probes organized into a plurality of second probe die groups each configured to contact a different one of the dies, wherein a test signal received on the second common communications channel is provided to probes in all of the second probe die groups and probes in each of the Y of the first probe die groups;
wherein the first communications channels comprise a plurality of first dedicated communications channels each connected to one or more of the first probes in only one of the first probe die groups; and
wherein the second communications channels comprise a plurality of second dedicated communications channels each connected to one or more of the second probes in only one of the second probe die groups.

10. The process of claim 9, wherein:
the dies are part of an unsingulated semiconductor wafer;
the receiving at the probe card assembly the first test signals and the receiving at the probe card assembly the second test signals are performed simultaneously during one touchdown of the probes of the probe card assembly onto the wafer; and
the providing the first test signals through the probe card assembly to the first probes of the probe card assembly and the providing the second test signals through the probe card assembly to the second probes of the probe card assembly are performed simultaneously during the one touchdown of the probes of the probe card assembly onto the wafer.

11. The process of claim 10, wherein during the one touchdown:
all of the one(s) of the first probes and all of the ones of the second probes connected to the second common channel contact dies located within a die area on the wafer in which fully formed dies are intended to be made on the wafer; and
none of the ones of the first probes connected to the first common channel contact dies located within the die area on the wafer.

12. The process of claim 10, wherein during the one touchdown:
all of the ones of the first probes connected to the first common channel contact dies located within a die area on the wafer in which fully formed dies are intended to be made on the wafer; and
none of the one(s) of the first probes and the ones of the second probes connected to the second common channel contact dies located within the die area on the wafer.

13. A test system for testing dies of a semiconductor wafer, the system comprising:
a tester configured to control testing of the dies;
a plurality of communications channels connected to the tester; and
a probe card assembly comprising an interface to the communications channels and a plurality of probes, the probes including first probes organized into a plurality of N first probe die groups each configured to contact a different one of the dies of the wafer, the probes further including second probes organized into a plurality of second probe die groups each configured to contact a different one of the dies of the wafer, wherein:

the tester is configured to control as a logical whole provision of first test signals through a plurality of first ones of the communications channels that are electrically connected through the probe card assembly to the first probes, wherein one of the first communications channels is a first common communications channel connected through the probe card assembly to probes in X of the N first probe die groups but not to probes in Y of the N first probe die groups, wherein X is at least two and Y is at least one; and the tester is configured to control as a logical whole provision of second test signals through a plurality of second ones of the communications channels to the second probes, wherein one of the second communications channels is a second common communications channel connected through the probe card assembly to probes in all of the second probe die groups and probe in each of the Y of the first probe die groups;

wherein the first communications channels comprise a plurality of first dedicated communications channels each connected to one or more of the first probes in only one of the first probe die groups; and wherein the second communications channels comprise a plurality of second dedicated communications channels each connected to one or more of the second probes in only one of the second probe die groups.

14. The system of claim 13, wherein:

the dies are part of an unsingulated semiconductor wafer; and the tester is further configured, simultaneously during one touchdown of probes of the probe card assembly onto the wafer, to control as a logical whole the provision of first test signals and to control as a logical whole the provision of second test signals.

15. The system of claim 14, wherein during the one touchdown:

all of the one(s) of the first probes and all of the ones of the second probes connected to the second common channel contact dies located within a die area on the wafer in which fully formed dies are intended to be made on the wafer; and none of the ones of the first probes connected to the first common channel contact dies located within the die area on the wafer.

16. The system of claim 14, wherein during the one touchdown:

all of the ones of the first probes connected to the first common channel contact dies located within a die area on the wafer in which fully formed dies are intended to be made on the wafer; and none of the one(s) of the first probes and the ones of the second probes connected to the second common channel contact dies located within the die area on the wafer.

17. The system of claim 14, wherein the tester is further configured to repeat the controlling as a logical whole the provision of first test signals and the controlling as a logical whole the provision of second test signals a plurality of times for a plurality of touchdowns of probes of the probe card assembly onto the wafer, wherein during each of the plurality of touchdowns:

either all of the one(s) of the first probes and all of the ones of the second probes connected to the second common channel contact dies located within a die area on the wafer in which fully formed dies are intended to be made on the wafer or none of the one(s) of the first probes and the ones of the second probes connected to the second common channel contact dies located within the die area on the wafer; and either all of the ones of the first probes connected to the first common channel contact dies located within the die area on the wafer or none of the ones of the first probes connected to the first common channel contact dies located within the die area on the wafer.

18. The system of claim 13, wherein the tester is further configured to:

monitor ones of the first communications channels for expected response signals; and continue to control as a logical whole the provision of first test signals and to control as a logical whole the provision of second test signals even if one of the expected response test signals indicates a die failure.

19. The process of claim 13, wherein the tester is further configured simultaneously to control as a logical whole the provision of first test signals and to control as a logical whole the provision of second test signals.

20. A probe card assembly comprising:

an interface to communications channels from a tester configured to control testing of semiconductor dies of a wafer, the interface comprising first individual connections to first ones of the communications channels and second individual connections to second ones of the communications channels;

a plurality of probes, the probes comprising first probes organized into a plurality of N first probe die groups each configured to contact a different one of the dies of the wafer, the probes further comprising second probes organized into a plurality of second probe die groups each configured to contact a different one of the dies of the wafer;

a plurality of first dedicated electrical paths each connecting one of the first individual connections to one or more of the first probes in only one of the first probe die groups;

a first common electrical path connecting one of the first individual connections through the probe card assembly to probes in X of the N first probe die groups but not to probes in Y of the N first probe die groups, wherein X is at least two and Y is at least one;

a plurality of second dedicated electrical paths each connecting one of the second individual connections to one or more of the second probes in only one of the second probe die groups;

a second common electrical path connecting one of the second individual connections through the probe card assembly to probes in each of the second probe die groups and to the Y probes in each of the Y of the first probe die groups;

wherein the first individual connections are configured to receive from the tester first test signals for testing as a logical whole the first group of dies; and wherein the second individual connections are configured to receive from the tester second test signals for testing as a logical whole the second group of dies.

* * * * *